(12) United States Patent
Johannet

(10) Patent No.: US 6,438,250 B1
(45) Date of Patent: Aug. 20, 2002

(54) METHOD FOR MAKING A CONDUCTOR, OR ELECTRIC CIRCUIT BALANCED IN RADIOELECTRIC INTERFERENCE SUCH AS MICRO-DISCHARGE AND CORRESPONDING CONDUCTOR OR CIRCUIT

(75) Inventor: Pierre Johannet, Paris (FR)

(73) Assignee: Electricite de France, Service National, Paris (FR)

( * ) Notice: Subject to any disclaimer, the term of this patent is extended or adjusted under 35 U.S.C. 154(b) by 0 days.

(21) Appl. No.: 09/284,255

(22) PCT Filed: Oct. 7, 1997

(86) PCT No.: PCT/FR97/01786

§ 371 (c)(1),
(2), (4) Date: Apr. 9, 1999

(87) PCT Pub. No.: WO98/16094

PCT Pub. Date: Apr. 16, 1998

(30) Foreign Application Priority Data

Oct. 10, 1996 (FR) .............................................. 96 12369

(51) Int. Cl.[7] .............................................. H04R 25/00
(52) U.S. Cl. ....................... 381/410; 381/409; 381/412; 381/415; 361/120; 361/143; 361/146; 361/159; 174/17 LF; 174/17 SF; 174/127; 174/126.1
(58) Field of Search ................................. 381/318, 189, 381/410, 409, 412, 415; 361/120, 121, 133, 143, 146, 147, 159; 174/13, 15.5, 15.6, 17 LF, 17 SF, 127, 126.1

(56) References Cited

U.S. PATENT DOCUMENTS 3,963,882 A * 6/1976 Lewis
3,991,286 A * 11/1976 Henricksen
4,091,139 A * 5/1978 Quirk
4,673,997 A * 6/1987 Gowda
4,749,506 A * 6/1988 Kitahara et al.
5,461,677 A * 10/1995 Raj et al.
5,717,775 A * 2/1998 Sakamoto
5,751,828 A * 5/1998 Ueda
5,894,524 A * 4/1999 Kotsatos
6,086,792 A * 7/2000 Reid

FOREIGN PATENT DOCUMENTS

EP          0 161 805        11/1985
EP          0 271 407        6/1988
WO          WO 85/00245      1/1985

* cited by examiner

Primary Examiner—Huyen Le
Assistant Examiner—Dionne N. Harvey
(74) Attorney, Agent, or Firm—Larson & Taylor, PLC

(57) ABSTRACT

The invention relates to a manufacturing process of an electrical conductor or circuit compensated for radio interferences, including those from the electrical circuit itself.

An application of a semi-conductor material (2) of resistivity coefficient allowing the external surface of the conductor (1) to the electrical circuit to be maintained at a static electrical potential near to that of the conductor (1) and the random electrical discharge currents to be absorbed is made to eliminate the interface micro-discharge interference phenomena.

Application in the field of HiFi, home automation, instrumentation.

12 Claims, 9 Drawing Sheets

SKIN EFFECT
(PRIOR ART)

FIG.1c. PROXIMITY EFFECT (PRIOR ART)

AMPLIFIER 1W
(PRIOR ART)

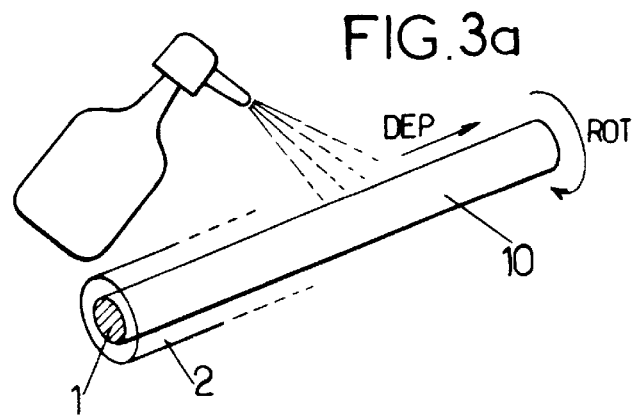
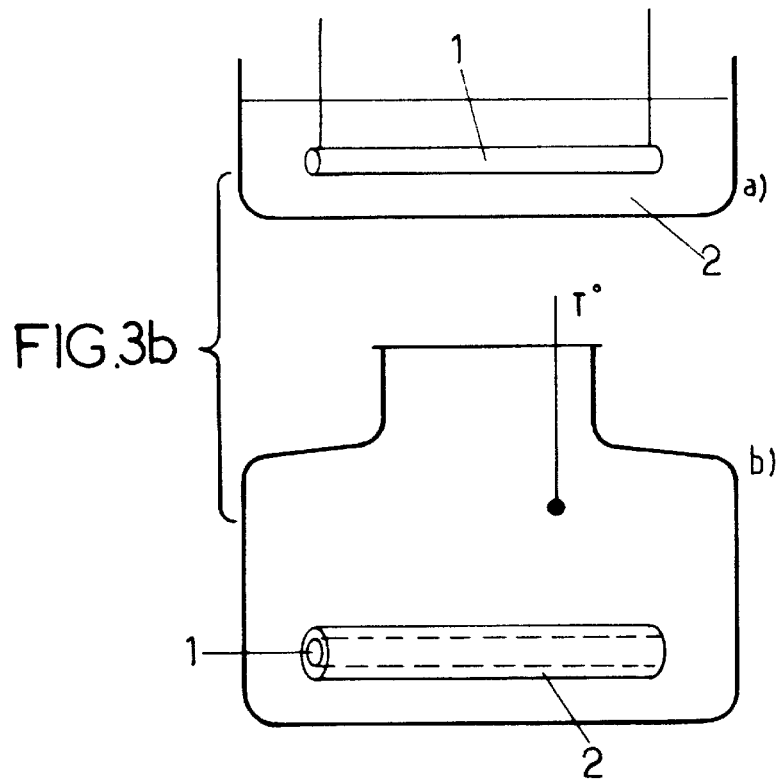
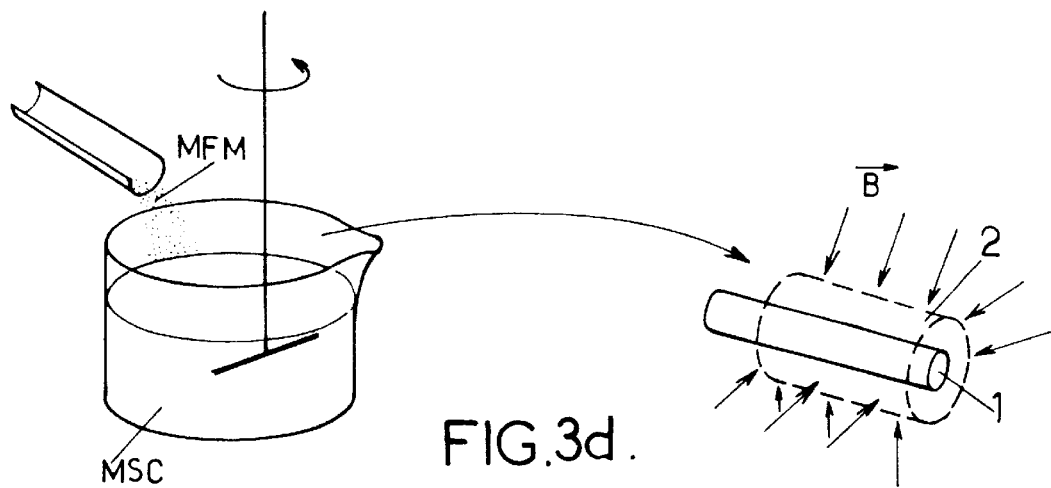

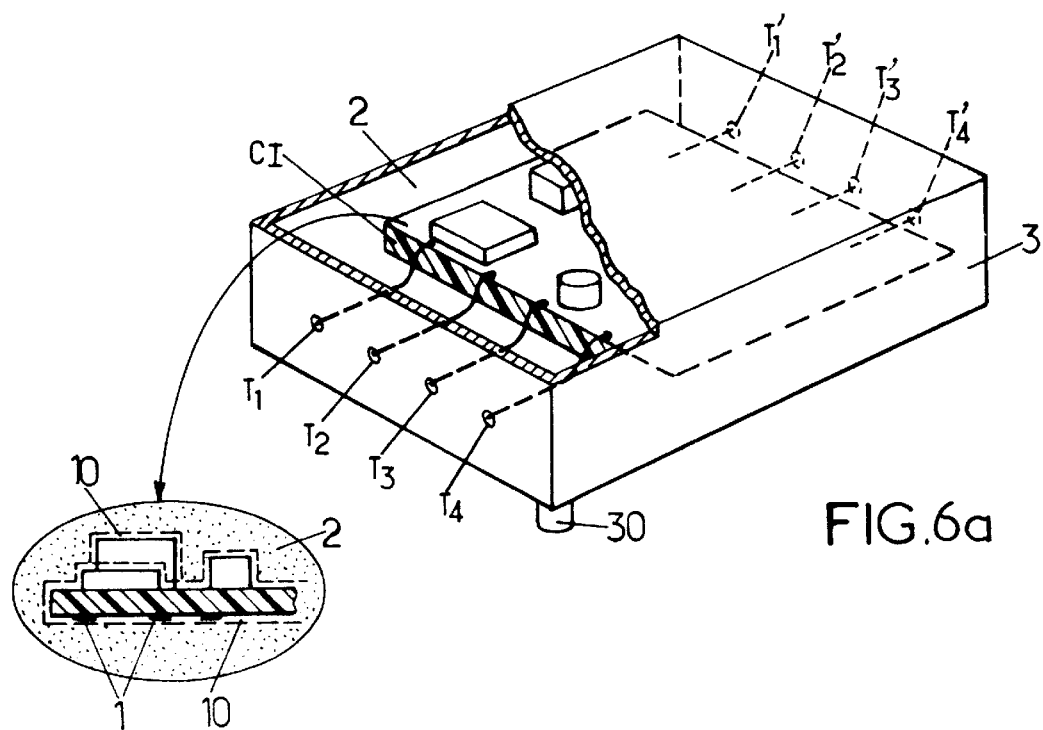
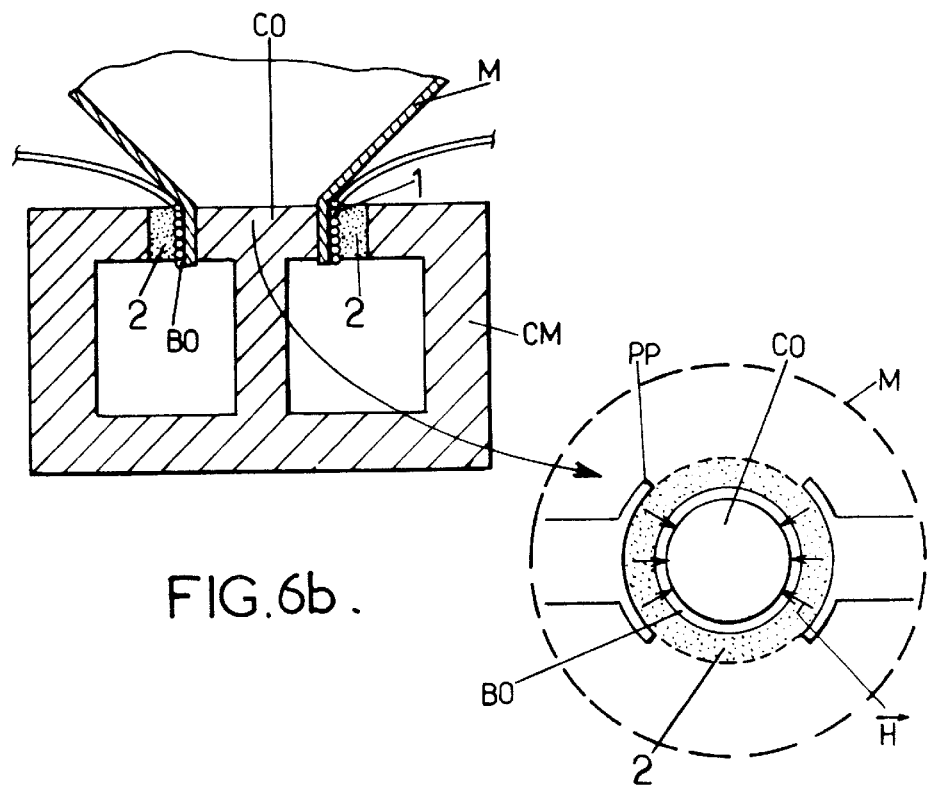

METHOD FOR MAKING A CONDUCTOR, OR ELECTRIC CIRCUIT BALANCED IN RADIOELECTRIC INTERFERENCE SUCH AS MICRO-DISCHARGE AND CORRESPONDING CONDUCTOR OR CIRCUIT

The present invention relates to a manufacturing process of an electrical conductor or circuit compensated for radio interferences such as micro-discharges, and an electrical conductor or circuit obtained by this process.

In the field of processing of electrical signals then their storage or their transformation into sensory phenomena directly perceived by human physiological receptors, numerous works have been carried out up to the present in order to maintain, indeed improve, the signal to noise ratio after each transformation, due to the processing, with the object of improving the reproduction and therefore the perception of these sensory phenomena.

Such concern is not moreover specific to the single field of sensory phenomena, such as the reproduction of sounds, but appears also in the much wider field of electronic signals creation, their transmission, their storage and their use by electronic or electrical transducers specially adapted to this purpose.

With regard more particularly to the field of creation, processing, storage and then reproduction of the sound in high fidelity technology, particularly, the HiFi field, some particularly well informed audiophile listeners, noted and reported, from 1970, that they could detect perceptible variations in tone between HiFi systems according to the nature of the power amplifier-loud speaker or acoustic enclosures connection cables.

Some did not hesitate, moreover, to note still more perceptible differences in musical quality, in their opinion, at the time of changing the modulation cables connecting, for example, a source such as a disc player, a microgroove disc or a tuner at the input of the power amplifier, or even of the pre-amplifier.

Quick studies conducted by recognized physicists, demonstrated, rightly, that the resistance in ohms of the most resistive of these wires or connection cables was very inferior to the impedance of loud speakers or acoustic enclosures, all the more so to the input impedance of amplifiers or pre-amplifiers, and that, consequently, such variability displayed above all a subjective character.

A more complete study, based on the theory of electrical lines, allowed taking into account the whole of the localized or distributed characteristics likely to affect the transmission and therefore the reproduction of these signals, i.e. in fact to the whole of the signals generated from a source or radiated in the radio space.

For an amplifier-loud speaker connection, the equivalent diagram can be reduced, as shown in FIG. 1a, to;
- a capacitance C between conductors, a function of the geometric size of the cables and the nature of the electrical insulations;
- an inductance L divided into two components L/2, corresponding to the magnetic field produced by the current flowing in the conductors;
- an internal impedance Zi, for each conductor comprising a resistive part and an inductive part due to the skin effect, on the surface of the conductors, and to a proximity effect of these latter.

As regards the skin effect or Kelvin effect, it is recalled that this phenomenon is characterized by the fact that in alternating current, the current density reduces, with the frequency, at the center of the conductor, and increases at the periphery, as shown in FIG. 1b.

For this phenomenon, the depth of penetration δ in meters is given by the relation:

$$\delta = \sqrt{\frac{\rho}{\pi \mu_0 f}} \quad (1)$$

relation in which:
ρ designates the resistivity of the conductor in Ω×m;
$\mu_0 = 4\pi 10^{-7}$ designates the vacuum permeability;
f designates the frequency of the transmitted signal in Hz.

Taking account of this phenomenon, because of the reduction of the actual conduction surface of the conductor, it is possible to define a cut-off frequency fc associated with a conductor radius r of specified nature:

$$fc = \frac{k^2 \rho}{2 \cdot \pi \cdot r^2 \cdot \mu_c} \quad (2)$$

relation in which:
k=1.910852
r designates the conductor radius,
ρ and $\mu_0$ having been defined previously.

The maximum radius of the conductor for a maximum frequency to transmit fc is given by:

$$r = K \sqrt{\frac{\rho}{2\pi \cdot fc \cdot \mu_0}} \quad (3)$$

Thus, for copper, fc=20 kHz, r=0.623 mm, i.e. φ=2r=1.25 mm is obtained. The depths of penetration are given by:

| f Hz    | δ mm  |
|---------|-------|
| 10      | 20.6  |
| 100     | 6.52  |
| 1000    | 2.06  |
| 10 kHz  | 0.65  |
| 100 kHz | 0.206 |

These results show that this depth varies a great deal as a function of the frequency of the transmitted signal, to be precise in the audiofrequency range. Consequently, it is recommended as far as HiFi technology is concerned to make modulation connections by means of a conductor with a strand diameter less than 6/10 mm, the connection between the amplifier and acoustic enclosures being made by means of strands of 5/10 to 6/10 mm placed in parallel in order to obtain cables with a cross section between 1.5 and 3 mm², as a function of the length, each strand being individually insulated. The only real effect of any use of cables with a greater cross section is a poorer attenuation of the signals at low frequencies and therefore a relative "raising" effect of these latter.

Besides the aforesaid phenomena, in particular as far as the amplifier-acoustic enclosure connection cables are concerned, these latter can be subjected, as shown in FIG. 1c, to a proximity effect. This effect only appears during transmission of periodic or pseudo-periodic signals, at high frequencies, the currents flowing in the parallel return conductors having the effect of minimizing the emitted magnetic flux. An approximate calculation enables an impedance coefficient value of the transmission cables to be established at high frequencies, greater than 10 kHz in the audio-frequency field, taking account of both the skin effect and the proximity effect, for two parallel conductors of circular cross section of diameter φ and the central axes of which are distant by D. This impedance coefficient, expressed in Ω/m, establishes the relation:

$$Zi = \frac{\rho}{Pm \times \delta \left(1 - \frac{k}{2}\frac{\phi^2}{D^2}\right)} \quad (4)$$

In this relation, K, ρ and δ are the parameters defined previously in the context of the skin effect phenomenon, Pm represents the perimeter of each conductor. The product Pm×δ represents the useful cross section presented to the current and the term $$\left(1 - \frac{K}{2}\frac{\phi^2}{D^2}\right)$$

represents the proximity effect contribution. This contribution is however negligible as soon as D>>φ.

The previous relation (4) is essential, for it enables it to be established, contrary to unconvincing conclusions or practices, that conductors having a same ohmic resistance and a same φ/D ratio have an absolutely identical behavior according to the transmitted signal frequency. Consequently, the choice of the nature of the constituent metal of the conductors, copper, gold, silver, aluminum, provided that the ohmic resistance and the φ/D ratio characteristics are satisfactory, is not able to have any influence on the cable behavior as a function of the transmitted signal frequency.

The theory of lines applied to the acoustic enclosure cables, each cable component being modeled by a transfer function Γ of characteristic impedance Zc=√(Z/Y), where Z represents the series impedance of the conductor, with Z=Zi+jLω, j=√−1 and ω=2πf, Y=jCω parallel admittance, and of propagation constant γ=√ZY enables the amplifier-acoustic enclosure function to be established, as is shown in FIG. 1d, in the form $$\frac{V_2}{V_1} = \frac{1}{ch\gamma l + \frac{Z_C}{z}sh\gamma l} \quad (5)$$

where z designates the complex impedance of the acoustic enclosure, l designating the length of the line, i.e. of the connection. For frequencies in the audio field and for a connection length l less than 10 meters, ch γl≡1 and sh γl≡γl, the relation (5) is simplified to:

$$\frac{V_2}{V_1} = \frac{1}{1 + l\frac{Z}{z}} \quad (6)$$

with Z expressed in Ω/m, z in Ω, and l in meters. The theory of lines shows therefore that in principle:

any amplifier-acoustic enclosure connection cable is assimilable to its own impedance;

the capacitance of this cable is negligible.

Taking account of the previous analysis, the only phenomenon likely to induce a perceptible variation in the sound quality of HiFi systems, as a function of the nature of the connection cables, can apparently be ascribed to the skin effect alone, or even the proximity effect.

Additional investigations then caused M. JOHANNET to take into account moreover the phenomena usually considered as "accessory", but nevertheless very real, such as:

the phenomenon of contacts between strands, the case of non insulated multi-strand conductors, the phenomenon of memory in the insulations of cables, a phenomenon in essence very complex.

The phenomenon of contacts between non insulated strands, as shown in FIG. 1e, causes the appearance of inter-strand current trickles, as well as intra-strand current trickles, the inter strand current trickles being subjected to non linear intra-strand resistances, in particular for low level signals. This phenomenon is accentuated in the presence of oxides at the interface of the strands, which explains the advantage of the use of copper or de-oxygenated materials. The solution consisting in using individually insulated strands, of diameter less than 6/10 mm, in order to combat the skin effect, has been proposed and is currently used. However, this solution introduces a difficulty connected to the very complex aforesaid phenomenon, relative to the phenomenon of memory in the insulations and at the level of the metal-insulation and insulation-air interfaces.

The phenomenon of memory of the insulations is known and has been particularly studied by Jacques CURIE at the end of the 19$^{th}$ century. It can be highlighted following the pulse discharge of an electrical capacitor charged to a starting electrical voltage V, by the more or less rapid return of the voltage, to the capacitor terminals, at a fraction of the starting voltage V. The hypotheses allowing this phenomenon to be explained require, either the complete non release, during the discharge, of the free electrons or ions which have penetrated, during the charge, into the interior of the insulating dielectric material of the capacitor, or an "inertia" of the molecules of the capacitor insulation, the polar axis of which is moved at the time of the charge but does not totally recover its initial position at the time of discharge, or again a combination of these hypotheses.

A proposed solution to reduce this phenomenon has consisted in polarizing the cable insulations by means of an external electrical voltage, applied to the insulation by means of a high resistance. Such solutions, applied to the amplifier-acoustic enclosure connection cable, PTT polarized cable, and to the polarized FLATLINE cable, have seen their level of result accepted in the audiophile circle and constitute a reference within the A.F.D.E.R.S., the French Association for the Development of Recording and Sound Reproduction, 6, rue Myrha, 75018 Paris.

This acceptable and accepted solution has not however allowed the physical nature of this undesirable phenomenon to be established. With regard to the HP PTT polarized cables, the very low resultant capacitance, some 10 pF/m , does not seem to be of the type to cause such a phenomenon. Similarly, for the FLATLINE modulation cable, its width not exceeding 1.2 mm cannot really pose a problem in relation to the skin effect, whereas the insulation used, TEFLON, polytetrafluorethylene, is one of the best electrical insulations, although not perfect.

Besides the aforementioned solutions, an existing solution, that consisting in using an enameled cable, had gained the attention of interested parties. In particular, these cables, used in tube amplifier output transformers have always demonstrated an excellent behavior, without appreciable reaction from well-informed audiophiles. They consist of a copper conductor of some tenths of a millimeter or more, covered with a layer of enamel with a polyurethane varnish base, in one or several layers.

As regards amplifier-loud speaker connection cables of enameled wires, each cable is constituted from two independent separate conductors, each conductor being constituted from 8 to 16 basic strands of 5/10 mm twisted enameled wire, to make a cross section of 1.57 to 3.14 mm², as a function of the length of the connection. In order to reduce to the maximum the skin and proximity effects, each basic wire is undifferentiated in the twist, and, consequently, occupies successively in the twist all the positions in the overall conductor cross section. The connection of the cable to a connection pin is carried out to professional quality by means of a tin bath at 600° C. which volatizes the enamel and tins the copper. A polarization can be made by means of an additional strand or by one of the strands not subjected to the signal to be transmitted.

As regards the modulation cable, the most immediate solution consists simply in connecting core and ground of the connectors by two enameled wires of 5/10 mm. In order to limit the capacitance of the cable, a tight twisting of the two enameled wires can be made, an optimum twisting with pitch close to 1 cm pitch being the only one conceivable. A significant improvement of this type of modulation cable can consist, as shown in FIG. 1f, in inserting a 1/1 transformer at the output of the modulation source and a ferrite core on the cable before the input on the amplifier. These measures allow the very disrupted common mode signals to be definitively blocked, signals passing simultaneously in the two conductors, when these signals stem from sources such as tuners or optical disc (CD) players for example. The aforementioned measures and improvements allow excellent results to be obtained equaling, indeed surpassing, appreciably, those obtained by means of HP PTT and FLATLINE polarized cables.

The physical nature of the improvement thus made, apart from the blocking of the common mode signals, did not always however immediately appear. For this reason, M. JOHANNET was led to pursue again his investigations starting from a particularly simple 2×1 W amplification circuit, the diagram of which is given in FIG. 1g. This amplifier drawing published in the Audiophile journal No.32, in France, March 1995, concerns an amplifier with integrated circuit and transistors, conceived originally so as to attenuate thermal distortion, considered in professional circles as the original sin of semi-conductor amplifiers.

With regard to the problem of transmission of electrical signals, the sole object of these investigations, this amplifier can be reduced to the diagram of FIG. 1h. The 1000Ω circuit, adjustable capacitance from 5 to 100 pF, allows the operation of the operational amplifier AOP to be stabilized. This circuit is not essential because the operational amplifier AOP, with a gain of 9.2, is intrinsically stable for this value of gain, but has been added because of the saturation effects in the amplifiers. Indeed, on a musical transient, the saturation, i.e. the limiting transient peak, does not matter to the audience. But this saturation is likely to disrupt the amplifier internal circuit, this latter being then incapable, because of "indiscrimination", of processing correctly the possibly weak signals which can follow this disruption. The adjustment of the value of C is carried out experimentally.

At the time of a first test, during these investigations, the value accepted by M. JOHANNET was 47 pF, the capacitor used being a fixed polystyrene capacitor. The subjective results to the listener were good, any feeling of high level peak limiting having disappeared, but the sound appeared, to the senses of the well-informed audiophiles, "lifeless", i.e. without finish.

A second test was then carried out by means of an adjustable TEFLON capacitor, marketed by the PHILIPS Company. This test appeared justified, insofar as such a professional quality capacitor using a dielectric material of the first order, TEFLON, was bound, by means of careful adjustment, to give superior results.

Against all expectation, the sound from the amplifier thus equipped is clearly degraded with an obvious degradation of the tonal quality, a sensation of mixing of the sounds, tending to a disappointing result.

A third counter check test was then carried out, this test consisting in replacing the adjustable TEFLON capacitor with an adjustable air capacitor, without insulation between electrodes. The effect was immediate with disappearance of the degradation of the tonal quality of the amplifier. An adjustment of this new capacitor to a value of the order of 30 pF enabled the regaining of, not only the excellent sound of the original amplifier to be regained, but also of an out of the ordinary capacity of this latter to withstand the signal limiting peaks as well as the subjective impression of a signal transmitted and amplified by an amplifier with a power at least equal to an effective 20 to 30 W.

The disastrous subjective tonal behavior of an electrical circuit or conductor, with on the face of it a capacitance of negligible value, 30 pF, and yet equipped with one of the better dielectric insulators currently used, cannot in any case be attributed to one of the phenomena mentioned previously in the description.

These investigations then led M. JOHANNET to attribute the unsatisfactory behavior of the insulation/conductor interface of the electrical circuits, such as particularly the capacitors, to the existence of dipolar molecules, adsorbed oxygen, at this insulation/conductor interface, as well as electrical micro-discharges at the conductor-insulating molecules interface likely to cause interference radiation generating radio interferences. Justification of such a discovery will be given later in the description.

The object of the present invention is a manufacturing process of a conductor or electrical circuit compensated for radio interferences caused particularly by electrical micro-discharges, of which the surface of this electrical conductor or this circuit or more generally the conductor-insulation interface is inevitably the seat.

Another object of the present invention is to use an electrical conductor or circuit compensated for radio interferences caused particularly by electrical micro-discharges present on the surface of this electrical conductor or this circuit, such micro-discharges on these compensated conductors or circuits being markedly attenuated or eliminated.

Another object of the present invention is to use conductors or electrical circuits likely to be used for the transmission and/or the processing of analogue or digital signals in technical fields as varied as domestic electrical or electronic equipment, HiFi and instrumentation and metrology equipment.

The manufacturing process of an electrical conductor or of a circuit compensated for radio interferences generated particularly by electrical micro-discharge phenomena present on this electrical conductor or this circuit under voltage, the object of the present invention, is remarkable in that it consists in making, on the external bare or insulation coated surface of this conductor or this circuit, an application of a semi-conductor coating material, this semi-conductor material having a resisitivity coefficient value allowing at the same time the external surface of the electrical conductor or circuit to maintain a constant local static value, close to that of the conductor, and to absorb all the random electrical discharge currents caused by these interference phenomena.

The process and the electrical circuit, the objects of the invention, find application not only in the field of HiFi electronic equipment construction but also in home automation, in instrumentation, metrology and the transmission of digital signals.

They will be better understood by reading the description below and observing the diagrams in which besides FIGS. 1a to 1h of the prior art:

FIG. 3a shows an illustrative diagram of the implementation of the process which is the object of the present invention;

FIG. 3b shows in an illustrative way a first variant of implementing the process which is the object of the present invention;

FIG. 3d shows a particular embodiment of the process which is the object of the invention in the case where the liquid or gel semi-conductor material has ferromagnetic properties like ferrofluids;

FIG. 6a shows a view of an electronic circuit previously coated with insulation on its bare conducting parts, packaged in a liquid semi-conductor material, according to the object of the present invention;

FIG. 6b shows a section view of a high frequency loud speaker with magnetic confinement of the semi-conductor material provided with ferromagnetic properties.

Prior to the description of the manufacturing process of a conductor or electrical circuit compensated for radio interferences according to the object of the present invention, theoretical justification of the observations and discoveries made by the inventor, M. JOHANNET, will be given in connection with FIGS. 2a to 2e.

Figure 1A:
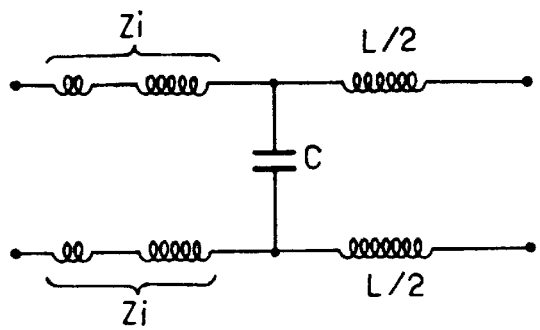
Figure 1B:
Figure 1D:
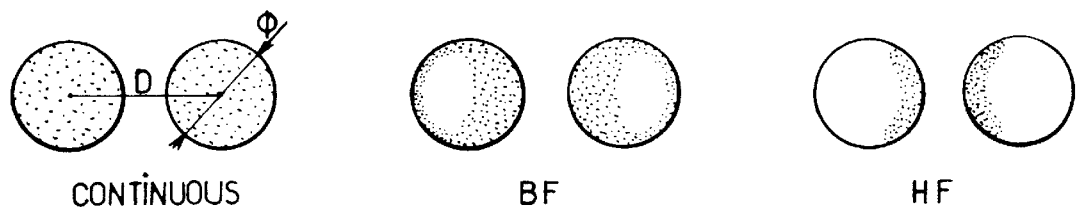
Figure 1D:
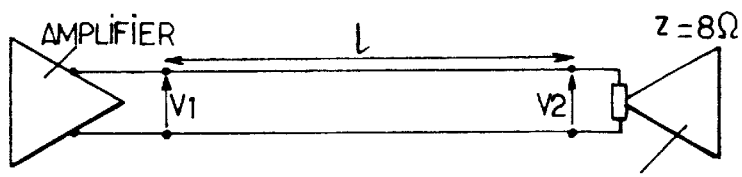
Figure 1E:
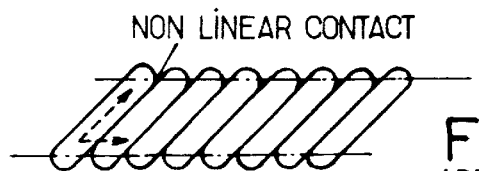
Figure 1F:
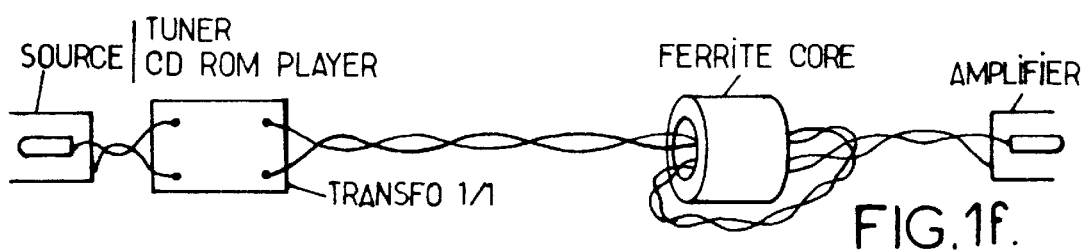
Figure 1G:
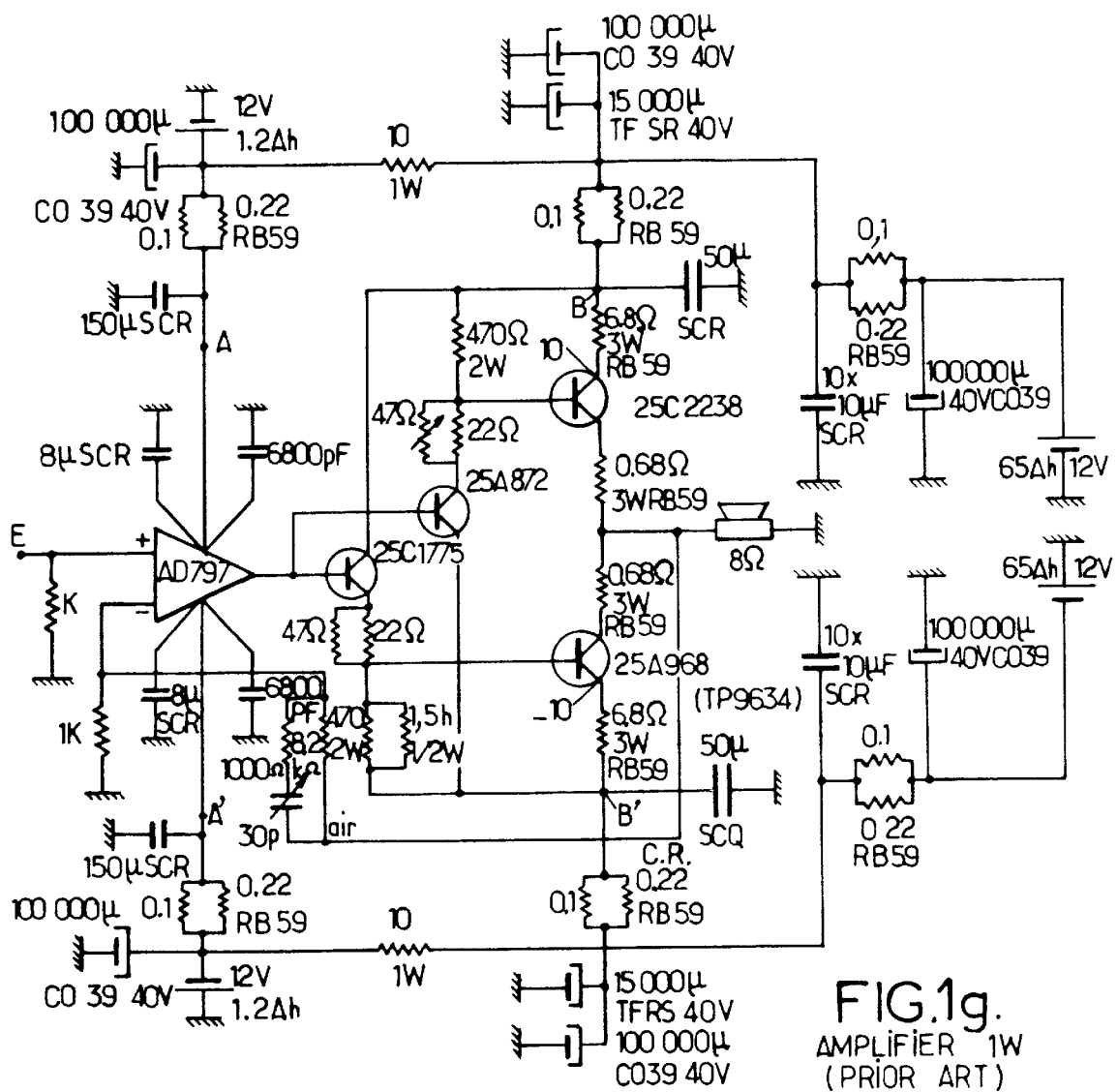
Figure 1H:
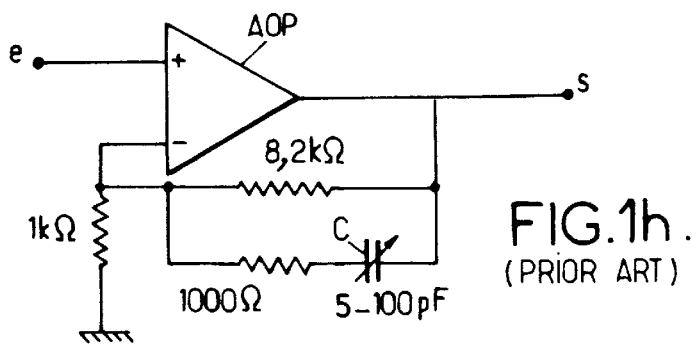

This justification is based on the investigations conducted on the amplifier shown in FIG. 1g and in FIG. 1h, as well as mentioned previously in the description.

Figure 2A:
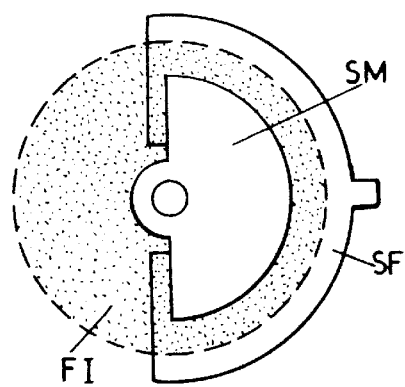
FIG. 2a shows diagrammatically the architecture of a variable capacitor with dielectric insulation.

By reference to FIG. 2a, in the first place it is recalled that an adjustable TEFLON (polytetrafluorethylene) capacitor is constituted from a stack of alternately fixed and movable sectors, designated on the aforementioned FIG. respectively by SF and SM respectively. A TEFLON insulating sheet F1 is inserted between each successive sector.

In fact, contrary to a generally accepted view, the surfaces both insulating and conducting are not bare but covered with layers of adsorbed or adherent air molecules.

More exactly, the metal surfaces of the fixed sectors SF and of the movable sectors SM exposed to the air become covered almost immediately with a monomolecular layer of adsorbed oxygen. It is shown that, besides the air molecules, other molecules can be found in contact with the conducting surfaces, molecules such as nitrogen, carbon dioxide, $CO_2$, or water vapor $H_2O$.

However, amongst these molecules, two at least may be subjected to a polarization effect under the effect of an electrical field: the oxygen and the water vapor.

The aforementioned molecules, in contact with the capacitor electrodes, i.e. with the metal surfaces of the movable sectors and fixed sectors, then polarize under the effect of the voltage applied on these electrodes and, of course, change polarity with a certain delay. The aforementioned molecules are subjected in fact to a cut over and finally to a relocation under the effect of an opposite voltage, which of course is produced frequently with audio signals transmitted from musical sounds.

Such a process explains the particularly harmful effect of the adjustable capacitor with polytetrafluorethylene previously mentioned. Indeed, the introduction of a delay in a counter reaction loop, i.e. in the 100Ω corrector circuit, adjustable capacitance 5–100 pF shown in FIG. 1h, is likely to lead to clearly audible disruptions at the output of the amplifier.

It is also shown that the aforementioned interference polarization phenomena is associated with micro-discharges at the surface of these conductors, these micro-discharges only being able to worsen the phenomenon because of the radio interference radiated beforehand or at the time of the creation of this type of interface micro-discharges. This phenomenon of micro-discharges will be described later in the description.

A first objection to the previous argument could consist in pointing out that the molecules of oxygen and water vapor in particular are also present in an air capacitor.

In fact, in the case of an air capacitor, the electric field at the surface of the conductor, i.e. the surfaces of the movable sectors SM and the fixed sectors SF, is much weaker in view of the absence of dielectric material, this field, in the known way, being on the contrary multiplied by the value of the relative permittivity of the dielectric relative to the air, in the case of a capacitor with added dielectric material. In fact, and because of the very high quality of the polytetrafluorethylene dielectric material, the electric field at the surface of the conductor, i.e. the fixed and movable sectors, is much more significant than in the case of the air capacitor. Moreover, considering the fact that the insulation does not disrupt the molecules, the adsorption phenomenon is permanent, these molecules enjoying thus a greater mobility and the delays introduced because of the counter reaction loop are then very weak, which explains the almost perfect behavior of the air capacitor.

In the case of an electrical conductor such as a cable covered with an insulating layer where the insulation adheres weakly, the same phenomenon can be observed and will be described in connection with FIGS. 2b to 2d.

In the aforementioned figures, has been shown in section, along a longitudinal plane of symmetry of the aforementioned cable, the central conductor C in for example copper, and the insulating layer I, the insulation being able for example to be a layer of material such as PTFE or PVC.

Figure 2B:
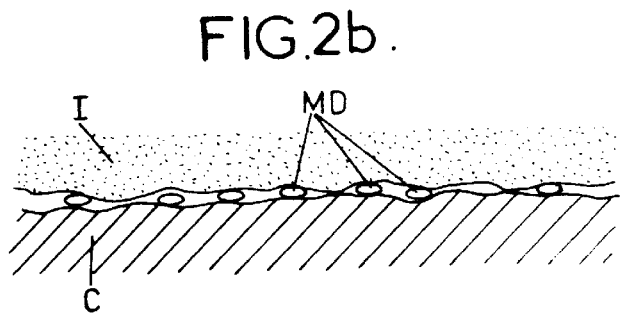
FIGS. 2b to 2d show the behavior of bipolar molecules always present at the insulating dielectric material/conductor interface of an electrical circuit or of a conductor or cable subjected to an electrical voltage from a given electrical or electronic signal.

As shown in FIG. 2b, the aforementioned dipolar molecules MD are present at the surface of the conductor C and the adsorption phenomenon is as it were frozen or at least reduced due to the fact of the presence of the insulating layer I. The adsorbed dipolar molecules cannot in any case be evacuated from the surface layer of the conductor C for the very reason of the presence of the insulation I.

Figure 2C:

As shown in FIG. 2c, under the effect of an electrical voltage present during the transmission of a signal such as an audio signal for example, the dipolar molecules MD are subjected to a polarization field existing between the electrical conductor C and the insulation I and are subjected, then, to a relocation or to an orientation directly connected to their position and to the instantaneous polarity of the transmitted signal.

Figure 2D:
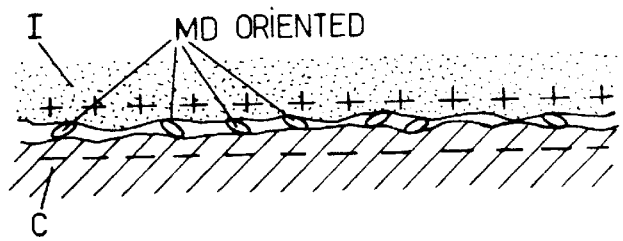

During the change of polarity of the transmitted signal, as shown in FIG. 2d, the dipolar molecules MD return to a different position in order to balance the electrostatic forces generated by the polarization field existing between the conductor C and the insulating material I, this process being associated with the micro-discharges.

Due to the fact that the aforementioned changes in position or orientation are produced with a certain inertia, even very weak, this inertia causes a certain delay in the propagation conditions of the transmitted audio signal, this delay causing a very audible echo effect.

The aforementioned justification appears of course essentially qualitative. However, it is indicated that the contact phenomena between conductors and insulations with addition of polarizable molecules are still very little known. As an indicative example, it is recalled that a phenomenon well studied and known for about a hundred years as the Branly effect, has not, to this day, received definitive explanation whereas it is known with certainty that it concerns contact phenomena between initially insulated metal strands.

Figure 2E:
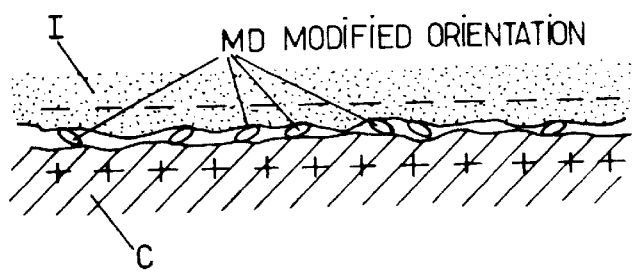
FIG. 2e shows an equivalent diagram of the capacitive coupling existing between two linear parallel conductors of circular cross section.

A modeling at the macroscopic level of the aforementioned phenomenon can be made as shown in FIG. 2e, for a connection cable formed by two parallel cylindrical conductors, CA and CB for example, this connection cable being able to correspond to the modulation cable previously mentioned in the description.

In the model shown in FIG. 2e is shown that:

$C_0$ represents the equivalent capacitance at the metal-insulation interface;

$C_1$ represents the capacitance between conductors due to their proximity;

$C_2$ represents the conductor-ground capacitance, i.e. the capacitance of each conductor insulated relative to its environment in the installation.

For a voltage E applied between the conductors CA and CB, the derived current has the expression:

$$I = \frac{E/2}{\frac{1}{jC_0\omega} + \frac{1}{j\omega(C_2 + 2C_1)}} \quad (7)$$

In the model proposed in FIG. 2e, it is pointed out that the capacitance $C_0$, the capacitance due to the metal-insulation interface, represents in fact the imperfect capacitance subject to the orientation and movement phenomenon of the dipolar molecules described previously in the description in connection with FIGS. 2b to 2d.

Considering the previous analysis, it then seemed timely, according to a particularly remarkable aspect of the observations and discoveries led by the inventor, M. JOHANNET, to reduce the influence of this capacitance $C_0$, which can of course have an uncontrolled and harmful influence on the musical quality, i.e. on the transmission qualities of the signal from the corresponding connection cables.

In a first accepted solution, the recommended measure has consisted in reducing as much as possible the influence of the aforementioned capacitance $C_0$.

The reduction of this influence has consisted of two complementary measures, applied to the making of a connection cable constituting a modulation cable between a source constituted by an optical disc player and the 1 W amplifier shown in FIGS. 1g and 1h.

This measure has consisted, on the one hand:

in using 5/10 mm enameled wires, one wire per conductor, because of the quality of the enameled wires previously mentioned in the description, the nature of this component being likely, according to the previous investigations, to reduce to the maximum the value of the capacitance $C_0$, and, on the other hand, in reducing as much as possible the influence of the terms $C_2+2C_1$, i.e. the capacitive coupling existing inherent to the bifilar nature of the connection.

This second measure consisted in spacing the conductors from the neighboring grounds and to space out to the maximum the constituent return conductors of the connection. In fact, the connection thus constituted has consisted of two 5–10 mm enameled wires, spaced out by about 1 to 2 cm, over a length of 50 cm, the length of the connection between the optical disc player source and the amplifier.

The result obtained met expectations, the signal reproduced by the amplifier and by the loud speakers or acoustic enclosures, all things equal in other respects, having appeared with unprecedented cleanness and naturalness.

Such a result allows the theoretical justification previously mentioned in the description to be validated and remains of course a breadboard model allowing the hypothesis of the particularly staggering harmfulness of the memory effects with regard to cables to be validated, in particular for modulation cables. Indeed, for such cables the capacitances put into play are noteworthy because the voltages transmitted are relatively high, fractions of volts, whereas the input or output impedances are not negligible, of the order of kΩ.

In the case of amplifier-loud speaker, acoustic enclosure connection cables, this same memory effect is likely to appear between two strands in contact, a local potential difference which excites this memory effect being able to exist, this memory effect phenomenon being able furthermore to be complicated with a skin effect phenomenon by putting multiple conductors in parallel.

The previous investigations have turned out to be extremely invaluable for the understanding of the behavior of modulation cables and amplifier-loudspeaker connection cables used particularly in HiFi equipment.

In particular, a quite critical point for the musical quality of connection cables has been revealed, that of the presence of gaseous dipolar molecules subjected to electrical fields existing between conductors and insulations, and which can be the medium for micro-discharges.

Such an observation explains the very satisfactory behavior of the enameled cable insofar as enameling at high temperature is likely to eliminate any trace of adsorbed dipolar molecules.

However, taking account of the very small thickness of insulation used to constitute the enameling, dipolar molecules are likely to adhere to the surface of the insulation, i.e. of the enamel, and are therefore likely also to disrupt the signal transmitted to the extent that these same dipolar molecules are also subjected to the electrical field generated by this signal.

Taking account of this observation, a new measure and a new test have consisted in passing over the aforementioned enameled wire conductors, constituting the connection by bifilar lines previously mentioned in the description, an anti-static type product likely to eliminate at least temporarily the accumulation of these dipolar molecules at the surface of the varnish, in order to totally validate the previously ventured hypothesis.

The result obtained is then immediate and the improvement, although subjective, is spectacular. This improvement carries particularly into the field of low register sustained frequencies the loss of which seems to persist very far while the register of moderate or medium frequencies then gains in coherence.

As a non-restrictive example, it is shown that anti-static products used with success were the following:

PHEMASTAT, marketed by the PHEM Company S.A., 1 avenue Georges Clémenceau, 93420 Villepinte, France;

ANTISTATIK 100, marketed by the KONTAKT CHEMIE Company;

STATIJELT, marketed by the JELT Company, 112 Boulevard de Verdun 92400 Courbevoie, France;

GRAPHIT 33, marketed by the KONTAKT CHEMIE Company.

Regarding this latter anti-static product, it has been shown that the tests have been carried out following the deposit of a graphite conducting layer, followed by wiping, the layer having to remain very thin.

The experiment showed that applications of the aforementioned anti-static products can be spaced but that it is preferable to replace them for sustained listening.

The processing of the constituent cables and conductors of these connection cables such as modulation cables or amplifier/loud speaker connection cables for HiFi equipment is effective however over a limited time, this time being a function of the temperature and the ambient humidity and being able to reach some hours. However, this operating method enables all the investigations, observations and discoveries carried out by the inventor, M.JOHANNET to be validated.

A manufacturing process of a conductor or an electrical circuit compensated for radio interferences generated in particular by the electrical micro-discharge phenomena according to the object of the present invention and allowing permanent results to be obtained approximately identical to those obtained though a treatment by means of an anti-static product will be now described in connection with FIG. 3$a$ and following.

In a general way, it is shown that the phenomena of dipolar molecule polarization and micro-discharges existing at the insulation/conductor interface of electrical cables or at the enamel/conductor interface, i.e. insulation-air of an enameled conductor, can of course be highlighted at the level of circuits, which are only a different assembly of conductors arranged within the context of one or several specified functions.

To this end, it is shown that the process which is the object of the present invention can consequently be used, not only in a way to manufacture conductors or electrical connection cables allowing the transmission of signals such as audio signals or others, but also in the context of the manufacture of electrical circuits compensated for radio interference generated in particular by these phenomena of electrical micro-discharges and/or of dipolar molecule polarization.

As a non-restrictive example, it is shown that the process, which is the object of the present invention, will be described for the general purpose, in the context of the manufacture of an electrical conductor compensated for radio interferences, the notion of conductor covering, as mentioned previously, the notion of a circuit for the reasons indicated.

As shown in FIG. 3$a$ for example, as a non-restrictive example, the process which is the object of the present invention consists in making, on the external surface of a conductor 1 or a circuit, an application of a coating of a semi-conductor material 2. This semi-conductor material has a resistivity coefficient value enabling at the same time the external surface of the electrical conductor 1 or the circuit to be maintained at a constant value of static electrical potential close to that of the conductor 1 and all of the random electrical discharge currents caused by the interference phenomena to be absorbed. As a purely illustrative example, as shown in FIG. 3$a$, it is shown that the conductor 1, a cylindrical copper wire for example, can to advantage be subjected to a translation Dep and simultaneously to a rotation Rot movement relative to its axis vis-à-vis a spraying system with an aerosol or pulverulent product, shown symbolically by a tank and a nozzle, controlled manually or in an automated manner.

Of course, in such an embodiment, it is shown that the speed of moving or of passing the conductor in front of the nozzle as well as the speed of rotation are calculated in a manner adapted in a way to constitute an approximately homogeneous sleeve 2 some $\mu$m thick, covering the whole of the conductor 1.

Regarding the semi-conductor material used, it is pointed out that the notion of semi-conductor is taken in terms relative to a non metallic body which imperfectly conducts electricity and the resistivity of which decreases when the temperature increases. This definition corresponds to the definition of the semi-conductor such as given by the Grand Dictionnaire LAROUSSE, 1982 Edition, page 9478.

Of course, the operating method, in order to carry out the application on the external surface of the conductor 1 or the circuit of the coating of semi-conductor material 2, is not limited to spraying. On the contrary as shown in FIG. 3$b$ for example, other operations may be used such as the dipping of the conductor 1 or the circuit in stage a) of the aforementioned FIG. 3$b$ in a bath of semi-conductor material for example, just as the immersion of the electrical conductor 1 or the circuit in this same bath of semi-conductor material in order, preferably, to achieve an impregnation of the external surface of the conductor 1, the immersion time being defined in a way so that the constituent molecules of the semi-conductor product in bath form can themselves be adsorbed at the level of the conducting surface of the conductor 1.

Moreover, and as shown in FIG. 3$a$, it is understood that other operations such as the projection of a pulverulent liquid or of an aerosol constituent of the semi-conductor material can be used.

In all cases, as shown at point b) of FIG. 3$b$, each operation is preferably followed by a stabilization operation of the semi-conductor material.

The semi-conductor material sleeve 2 thus obtained after the stabilization operation can be liquid or solid, or if the need arises in gel form.

As shown in an illustrative way in FIG. 3$b$, when the semi-conductor material 2, after the stabilization operation, is solid or in gel form, the aforementioned stabilization operation can consist of a controlled drying operation.

As a function of the nature and of the semi-conductor product used, the drying can be carried out, following the application of a layer of semi-conductor material 2 or if the need arises two layers or several layers of semi-conductor material, in the open air, i.e. at ambient temperature, for a period of two hours between each application, or, on the contrary, in order to accelerate the process, in a controlled atmosphere, i.e. in an oven, the conductor 1 fitted with its sleeve or layer of semi-conductor material 2 being placed in a heated enclosure for example at a temperature of the order of 60° for one hour.

More particular examples of embodiments of implementation of the process, the object of the present invention, will be now given below for the case of a specific semi-conductor product. The embodiment method described below has been carried out with a varnish type semi-conductor product, marketed by the VON ROLL ISOLA Company with the reference 8001, this product being commercially distributed by the UDD-FIM Company in France. As an alternative example, there is a coating miscible in water, with an intrinsic polymer conductor base, polypyrrol, manufactured and marketed in the Netherlands by the DSM Company, compare the Industries et Technique journal, No 761 bis published in France. As an additional alternative, colloidal graphite can be used, distributed by the KF-Electronique Company in France.

The operating method has consisted in covering the modulation cables constituted for example by an untwisted 5/10 mm enameled wire, each return conductor being coated with a layer of this varnish of the order of some $\mu$m. The conductors spaced by a distance of about 1 cm in order to make a connection between the source and the amplifier in the experimental conditions shown in FIG. 2e, have enabled then a very noticeable, immediate and lasting improvement of the transmission of the signals delivered by the source to be obtained.

A similar operation has been carried out with regard to the connection cables between the amplifier output and the loud speakers or acoustic enclosures. The connection cables were constituted by 5/10 mm twisted enameled wire conductors, which have been subjected to a similar spraying in order to constitute a layer of some microns thick.

The application of such a layer of semi-conductor material, in the form of a varnish, has then given a particularly spectacular result, characterized by an almost complete disappearance of the subjective background noise.

The combination of the modulation cables treated in this way and the connection cables between the amplifier and the loud speakers, these cables consisting of enameled wire conductors, impregnated with semi-conductor varnish in the previously mentioned conditions, is particularly impressive.

Although of a subjective nature, it is shown that the perception is then characterized by a particularly remarkable impression of softness of the sounds, of absence of distortion and of background noise, of analysis of the micro-signals without loss of coherence of the transmitted signal. From the perceptual point of view, it is shown that the experienced perception is that of the discovery of a different content of the storage medium played by the source.

The aforesaid implementation of the process, which is the object of the invention, has however demonstrated that in order to increase the life span of the treatment made to the connection cables, modulation cables and amplifier-loudspeaker connection cables, it was preferable to observe the precautions below:

perfect mixing of the product by means of a palette mixer for example;

application of a first thin layer possibly diluted with alcohol;

application of a second layer after drying the first layer, i.e. at least half an hour after application of the first layer.

The quality of the results obtained can, after consideration and successive study, be attributed to:

the research for an optimum resistivity of the semi-conductor material layer applied on the electrical conductor, the research for an intimate, almost perfect contact between the semi-conductor material with the conducting parts of the conductor conveying the signal or with the insulating varnish which covers these conducting parts.

Physical measurements made on the connection cables treated in this way have shown that the semi-conductor material layer had a resistivity coefficient $\rho$ between 0.1 $\Omega \times$m and 100 $\Omega \times$m. The resistance of the semi-conductor material layer associated with the semi-conductor varnish had a value between $10^3$ and $10^5 \Omega$.

The previous new investigations and observations carried out by the inventor, M. JOHANNET, have then led this latter to carry out an implementation of the process, the object of the present invention, starting with totally liquid semi-conductor materials, i.e. taking the previous definition given in the description, in order particularly to satisfy the condition relative to the almost perfect, intimate contact.

In a first approach, the accepted liquids were electrolyte liquids.

A particularly advantageous accepted solution consisted in using water with sodium chloride NaCl added dissolved in a way to obtain adapted resistivity coefficient values.

As a non-restrictive example, the concentration and the resistivity coefficient corresponding to the solutions used were the following:

| Concentration NaCl g/l | $\rho \, \Omega \times$ m |
| --- | --- |
| 0.6 | 9.1772 |
| 5 | 1.2005 |
| 10 | 0.6285 |
| 20 | 0.3349 |
| 28 | 0.2441 |

The law giving the value of the resistivity coefficient $\rho$ of the solution as a function of its salinity S, establishes the relation:

$$\rho = 5.3676 \, S^{-0.927} \text{ at the temperature of } 20° \text{ C.} \quad (8)$$

In this relation, the salinity is expressed in g/l and the resistivity in $\Omega \times$m.

Successive experiments have shown that the optimum resistivity of the solution in order to obtain a maximum absorption effect of the aforementioned radio interference, is set at the level of the value $\rho = 1 \times \Omega \times$m to a strength of almost 10.

In these conditions and in a particularly advantageous embodiment of the process, the object of the present invention, the saline solution used can be constituted by the physiological salt solution controlled to 9 g/l. The optimum resistivity coefficient of the solution is then $\rho = 0.7 \, \Omega \times$m.

According to an embodiment variant, the saline solution can be constituted by a solution of potassium chloride KCl with the concentration 11 g/l. This saline solution has the advantage of a same ionic mobility for the positive and negative ions. In every case, the saline solution is preferably with a pH equal to 7. Moreover, anti-bacterial and anti-algae stabilizing products can be added.

In such a case, when the semi-conductor material used after the stabilization operation is liquid or in gel form as the need arises, the process which is the object of the invention can be implemented in the manner below, which will be described in connection with FIG. 3c. The operating method enabling the implementation of the process, the object of the present invention, will be described on the basis of this figure in the case of the making of an amplifier-loud speaker connection cable for example.

In such a case, the conductor 1 can to advantage be made in the form of 8 strands of 5/10 mm enameled copper wire, such as the enameled wire referenced ST2.NG marketed in France by the LE GUIPAGE MODERNE Company. These strands are twisted in pairs in order to correct the skin and proximity effects, as previously mentioned in the description.

Figure 3C:
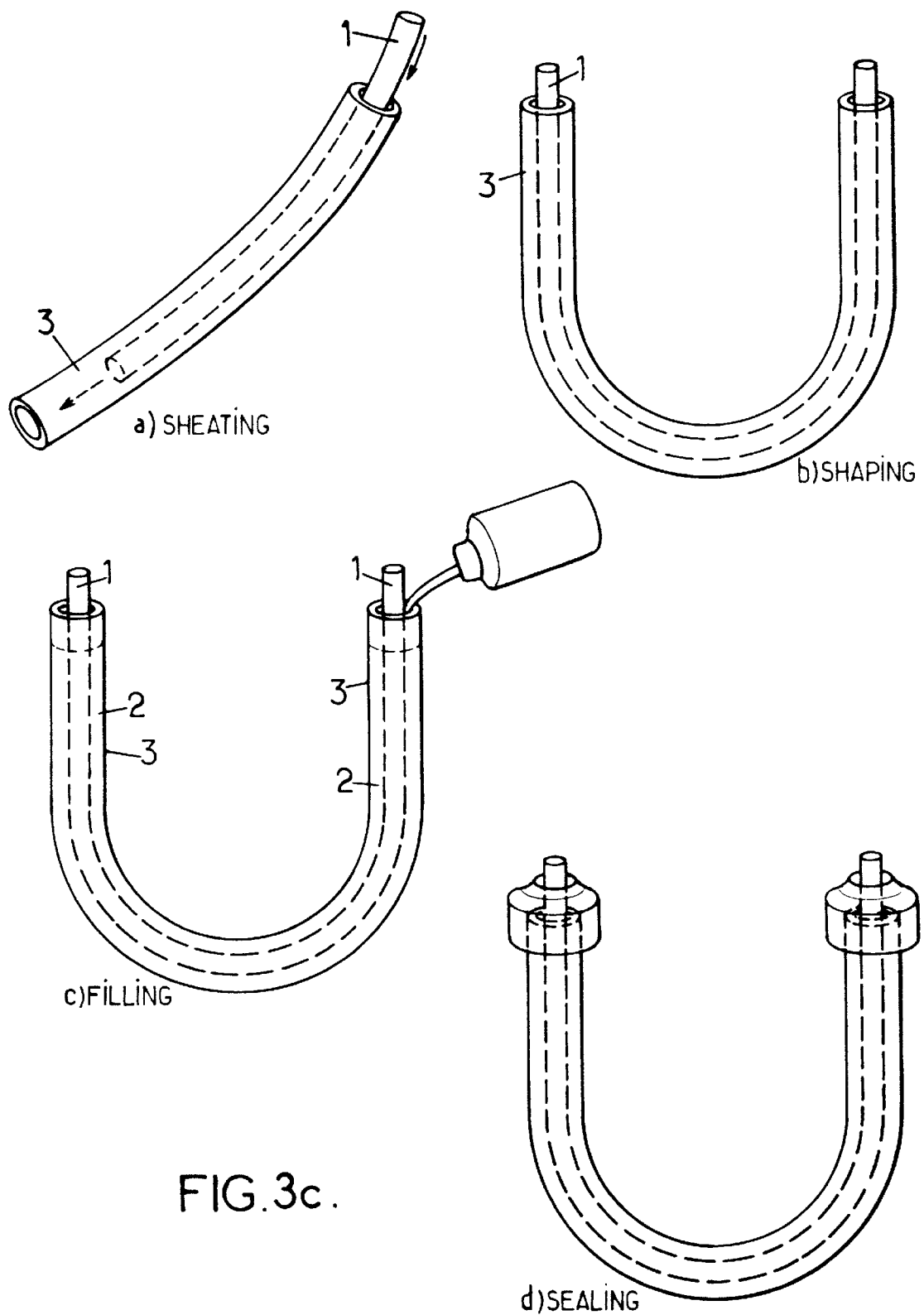
FIG. 3c shows in an illustrative way a second variant of implementing the process which is the object of the invention in the case where the semi-conductor material used is in liquid or gel form after packaging.

The semi-conductor material solution being available in the form of physiological salt solution for example, the stabilization operation can consist, as shown in FIG. 3*c*, in carrying out in the first place an operation consisting in encapsulating the conductor 1 or electrical circuit in a definitive sealed enclosure 3. This operation of sheathing is shown at the point a) of FIG. 3, the sealed enclosure 3 being able to consist, as a non-restrictive example in a 4/7 mm polyethylene tube.

The aforementioned stage a) of sheathing can then be to advantage followed by a stage b) of shaping, shown at the point b) in FIG. 3*c*, a stage in which the assembly is configured into a U shape for example, the ends of the conductor 1 passing beyond the ends of the sealed enclosure 3.

The actual shaping stage b) is then followed by a filling stage c), shown at the point c) in FIG. 3*c*, of the interstice made between the conductor 1 and the sealed enclosure 3 by means of the saline solution. In FIG. 3*c*, at its point c), it is shown that the filling is shown in an illustrative way by means of a tank or pipette as a non-restrictive example. It is pointed out however that in order to eliminate the appearance of air bubbles in the saline solution contained in the sealed enclosure 3, in an advantageous way, such a filling can be made, preferably, by means of a suction operation.

The filling stage c) is then itself followed by a stage d), shown at the point d) of FIG. 3*c*, constituting a sealing of the ends. Preferably, the waterproof sealing appropriate to the definitive sealed enclosure can be made by means of a silicon adhesive intended to seal the ends of the sealed enclosure 3, the ends of the conductors 1 passing through the sealing made in this way, the whole being covered by a fitting or thermo-retractable sleeve placed on each end in order to protect the sealing. For a perfect sealing, it is conceivable to surround the end of the tube and the conductor with a polytetrafluorethylene strip of ribbon covered with a thin layer of silicon joint, the whole being held by a thermo-retractable sleeve. In an advantageous way, the sealing of the ends can be made on tubes or self-fusible thermoplastic material covers, by means of a heating jaw clamp.

The same process can be applied for the manufacture of modulation cables. In such a case, it is pointed out however that the conductor 1 is a simple 5/10 mm enameled wire, while the sealed enclosure 3 is constituted by a 3/6 mm polyethylene tube or by any equivalent tube. This embodiment method is not restrictive and it can be conceived, for each constituent conductor of the modulation connection cable, to use two twisted enameled wires in order to constitute each conductor 1 of the connection.

It is pointed out in particular that, besides the intrinsic quality accepted in enameled wires for the constitution of the connections of modulation cables, already mentioned in the description, the presence of the enamel enables a protection of the copper conductor from any attack by the saline solution to be ensured, which enables the transmission quality properties to be retained in an approximately permanent way.

The use of modulation cables and amplifier-loud speaker connection cables obtained according to the process, which is the object of the present invention, such as described in connection with FIG. 3*c*, has enabled excellent listening results to be obtained, the listening quality and the tone being superior to those obtained with the projection of a semi-conductor varnish previously mentioned in the description when the resistivity qualities of this semi-conductor varnish are at their optimum value.

The process which is the object of the present invention is not restricted, when the semi-conductor material after the stabilization stage is liquid, to the embodiment method described with FIG. 3*c*. Indeed, as it will now be explained in connection with FIG. 3*d*, when this semi-conductor material after the stabilization operation is liquid or in gel form, this stabilization operation can consist to advantage of adding to the semi-conductor material an element having ferromagnetic properties in order to generate a ferromagnetic compound having semi-conductor material properties. In FIG. 3*d*, has been shown this stage of implementation of the process in an illustrative way by a mixing operation by means of a palette mixer of a liquid semi-conductor material, called MSC, and a ferromagnetic material in the form of a pulverulent in order to make a corresponding material, either liquid or in gel form.

As shown additionally in FIG. 3*d*, the ferromagnetic compound having semi-conductor material properties obtained following the aforementioned mixing operation, is then applied onto the conductor C in order to constitute for example a layer or sleeve shown dotted in FIG. 3*d*, and the assembly, in particular the sleeve 2 of semi-conductor material constituted by the ferromagnetic compound having properties of semi-conductor material, is then subjected to a permanent or maintained magnetic field, illustrated by the reference marked $\vec{B}$ in FIG. 3*d*, in order to ensure the confinement of the ferromagnetic compound having the properties of semi-conductor material on the external surface of the conductor 1 or the electrical circuit.

The process which is the object of the present invention, in the embodiment method described in connection with FIG. 3*d*, finds a particularly advantageous application in the field of high fidelity for radio interferences compensation of the loud speakers themselves, and not now of the connection between amplifiers and loud speakers and acoustic enclosures, as will be described later in the description.

A more detailed description of electrical circuits or cables compensated for radio interference generated in particular by electrical micro-discharge phenomena present on the external surface of these circuits or electrical cables, when those are supplied with electrical voltage, will now be given in connection with FIGS. 4*a* to 4*c*, these circuits or electrical cables being of course obtained by implementation of the previously described process.

Figure 4C:
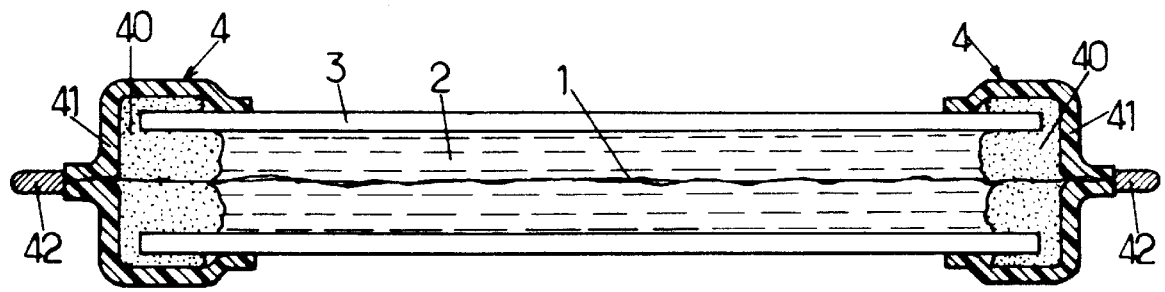
FIGS. 4a, 4b and 4c show, as a perspective view and as a sectional view along a longitudinal plane of symmetry, a conductor or circuit obtained by implementing the process according to the invention
Figure 4A:
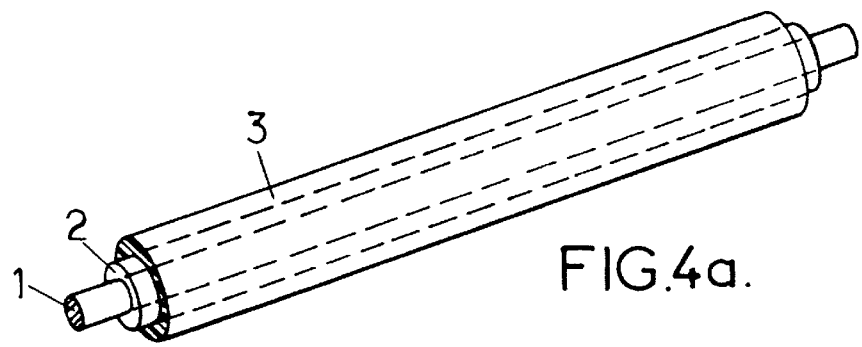

As shown for example in FIG. 4*a*, the conductor or electrical circuit 1 comprises, on its external surface, a coating 2 of semi-conductor material, the notion of semi-conductor material having been previously defined within the context of the description of the process which is the object of the present invention.

In a general way, it is pointed out that the semi-conductor material 2 forms a sleeve covering the electrical conductor 1 or, at the very least, a layer covering an electrical circuit, as will be described later in the description. The semi-conductor material has a resistivity coefficient value enabling at the same time the external surface of this electrical circuit or electrical conductor to be maintained at a static electrical potential with a constant local value, near that of the circuit or of the conductor 1, and the whole of the random electrical discharge currents caused by the aforementioned interference phenomena to be absorbed. The semi-conductor material can be solid, or liquid or in gel form, and can consist for example of a thin layer of some μm deposited by vaporization of the semi-conductor varnish reference 8001, marketed by the VON ROLL ISOLA Company.

Preferably, but in a non-restrictive way, the assembly can be sheathed by a thin protective sheath 3, which enables a protection of the semi-conductor material layer and the assembly in this way constituted to be ensured. In a general way, it is pointed out that the conductor 1 can be constituted by a copper electrical wire, enameled or not, of appropriate cross section.

Figure 4B:
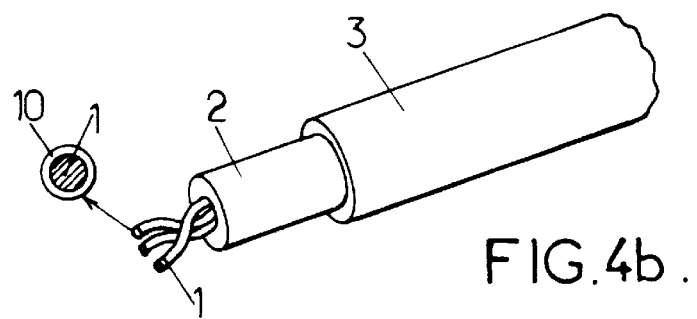

In an embodiment variant such as shown in FIG. 4b, the electrical conductor 1 can be constituted by several strands of enameled twisted copper wires, the central core carrying the reference 1 and the enamel the reference 10, as shown in FIG. 4b.

In every case, the protection sheath 3 can be added in order to protect the assembly.

Finally, in the case where the semi-conductor material is a saline solution for example, such as physiological salt solution, this electrical circuit compensated for radio interferences which is the object of the present invention, as shown in section along a longitudinal section plane on FIG. 4c, can comprise to advantage the sealed enclosure 3 constituted by a polyethylene tube for example. The sealed enclosure 3 partially contains the electrical circuit or conductor 1, which is constituted, either by an enameled 5/10 mm twisted electrical wire, or by a single enameled 5/10 mm wire for example. In this way, a major part of the electrical circuit 1, or electrical conductor 1, is immersed in the liquid or gel form semi-conductor material, only the ends intended to make the connections not being immersed in the aforementioned semi-conductor material.

Furthermore, as will be observed in FIG. 4c, connection terminals 4 outside the sealed enclosure 3 are interconnected to the major part of the immersed electrical circuit.

As shown in FIG. 4c, the connection terminals 4 can to advantage be constituted by a sealing 40 ensuring the sealed closing of the sealed enclosure 3 at each of its ends, this sealing 40 being made for example by a silicon mastic. The assembly can be covered with thermo-retractable sleeves 41, a connection contact or connection terminal of the banana plug type 42 for example being interconnected to the conductor 1, the connection pin 42 being preferably taken and held by the thermo-retractable sleeve 41. Such a method of manufacture enables modulation cables or amplifier-loud speaker connection cables of specified standard length to be made having a good stability in weather and transmission conditions for electrical signals of the first order.

A justification for the implementation of the process, which is the object of the present invention, and of the results obtained by means of the structure of the electrical cables and circuits compensated for radio interferences as previously described with FIGS. 4a to 4c, will now be given relative to the phenomenon of random micro-discharges likely to be produced at the surface of any electrical conductor not compensated according to the process which is the object of the present invention.

Figure 5A:
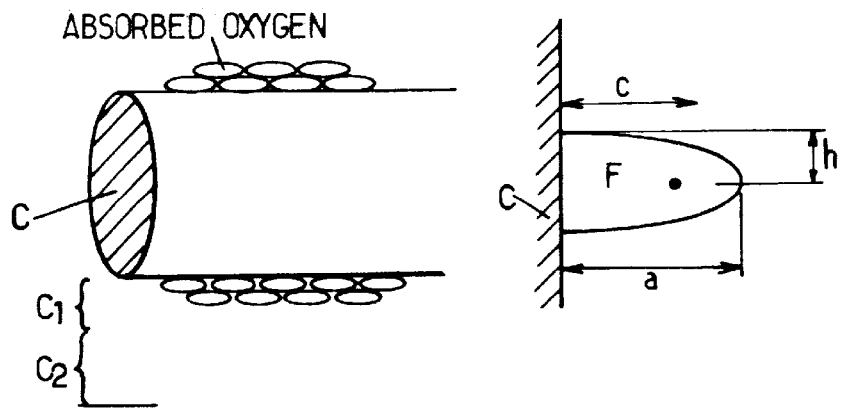
FIGS. 5a and 5b show modeling diagrams of the electrical micro-discharge phenomenon at the insulating metal interface of an electrical conductor.

In the case of a cylindrical electrical conductor C, shown in FIG. 5a, this electrical conductor being supposed bare, such a newly manufactured conductor is almost instantaneously covered with one or several layers of air but more particularly with oxygen, which has a particular avidity for metals, except gold.

In the particular case of copper, an oxidation process starts to occur, which slows down after some hours.

Consequently, there always exists a layer of one or two molecules depth of adsorbed gas such as oxygen, nitrogen or carbon dioxide gas, or even water vapor, complicated by a phenomenon of oxidation commencement.

The application of an electrical potential during the transmission of a signal by means of such a conductor C, produces on this conductor and in particular at the conductor/insulation interface a set of discharge phenomena called interface micro-discharges.

Such a phenomenon can be linked with the phenomenon known under the name of crown effect on high voltage lines, although the orders of magnitude of the voltages in play are very different.

In the case of interface micro-discharges, these occur for extremely low voltages, of the order of μV, and only appear immediately close to the conductor C, i.e. to its external surface. It is understood in particular that, although the voltages involved at the level of the unevennesses and rough patches of the aforementioned external surface are some μV, these potential differences, added to the roughness or the granulometry distances of the order of μm, are likely to generate significant local electrical fields, of the order of several volts per meter.

Consequently, the phenomenon of interface micro-discharges are also linked to the Branly effect previously mentioned in the description.

An analysis of the interface micro-discharges phenomenon from the crown effect can be made by reference to the published study by Claude GARY and Marcel MOREAU relative to this crown effect, in a work entitled "L'effet de couronne en tension alternative" ("The crown effect in alternating voltage") published in the Librairies Eyrolle, in Paris, France, in 1976.

Some elements of this study can be taken up and applied to the interface micro-discharges phenomenon.

For a cylindrical conductor of radius r applied with an electrical potential V, the electrical field at the surface of this latter confirms the relation:

$$E = \frac{V}{r \cdot \ln\frac{D}{r}} \tag{9}$$

The value of the field expressed by this relation is in V/m, D represents the distance of the conductor C to the neighboring conductors or the reference potential, r represents the distance relative to the surface of the conductor, ln designates the Naperian log.

It is understood of course that the local value of the electrical field can be increased by the spike effect when unevennesses are present on the conductor. This is precisely the case of filings enabling the Branly effect to be observed, the industrial conductors coming from dies being of course always secured in profusion with this type of unevenness on their lateral surface.

On the molecular scale, this field can of course be locally very significant.

For an unevenness simply modeled in the shape of a half ellipse as shown in FIG. 5a) on the right part, relative to the surface of the conductor shown vertical, the value of the field is written:

$$E_{\max} = E_0 \frac{c/ax(c/h)^2}{arg \cdot th \cdot (c/a) - c/a} \qquad (10)$$

In this relation:
c represents the distance of the focus of the ellipse to the surface of the conductor C,
a represents the distance of the top of the ellipse, i.e. the unevenness relative to the surface of this same conductor C,
h represents the transverse half dimension of the ellipse.

The more pointed the ellipsoid, therefore the unevenness, the smaller the ratio c/a and the more significant the multiplying factor of the value of the field generated near to the unevenness relative to the value of the field $E_0$ near the surface of the conductor C.

As a non-restrictive example, it is pointed out that for c/a=0.7 and c/h=3, $E_{max}/E_0$=37.7.

Whereas in the classical crown effect, discharges of different types appear at the top of these unevennesses as a function of the value of the applied voltage and of the polarity of the signal, these discharges being of the Townsend avalanche type, positive discharges, Trichel pulses for pulse currents with relaxation frequencies of 1 to 100 kHz for example, in the case of interface micro-discharges on the contrary, these discharges no longer occur in the surrounding air but in the thin insulating layer in contact with the conductor, i.e. its peripheral surface.

Following the manufacturing method of the electrical cable used, i.e. extrusion, bonding, polymerization at the die outlet, some gaseous molecules can for example be trapped between the insulating material and the conductor C itself. Furthermore, on the molecular scale, the manufacturing unevennesses on the peripheral surface of the conductor C are significant.

In the case of bare conductors, there always exists one or two, indeed several, layers of adsorbed molecules, as mentioned previously. For the non precious metals, particularly copper, an oxidation of its surface layer almost always occurs.

It is therefore in these molecular layers, in immediate contact with the conductor C, adsorbed ambient gas or dielectric when the dielectric perfectly adheres, that the phenomenon of interface micro-discharges occurs as a function of the local dielectric field and of the insulating metal structure of the considered interface.

Although the physical phenomena brought into play are still very little known, a modeling of these interface micro-discharge phenomena will be proposed in connection with FIG. 5b and FIGS. 5c to 5f.

These micro-discharge phenomena leading to an audible degradation of the signal, as related previously following the works and observations mentioned in the description, these lead to disruptions in the audio frequency spectrum between 20 Hz and 20 kHz.

Such an observation implies, in the case of straight front rapid discharges, that these must appear in a recurrent form with a recurrence period in the audio frequency band. This is the case for example of Trichel pulses in the case of the crown effect.

Figure 5B:
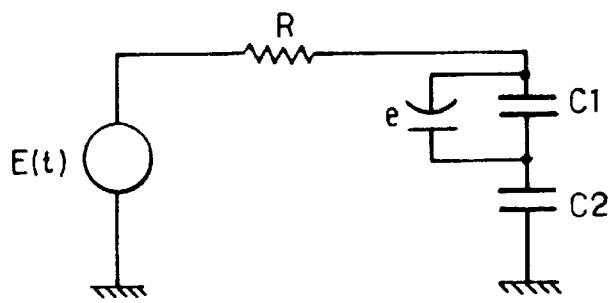

In the case of interface micro-discharges, it is then possible to model the structure of the interface by means of the diagram shown in FIG. 5b. This modeling is shown in connection with FIG. 5a and the symbols used in FIG. 5b for this modeling represent:

E(t), a voltage source, i.e. eventually a voltage induced on the cable, either by the signal to transmit, or by an external radio interference;

R represents the internal resistance of the interface;
$C_1$ represents the capacitance of the first insulating layers immediately in contact with the conductor. It concerns therefore the air in the case of a bare conductor or the applied insulation on an insulated conductor;
e is a spark gap which short circuits the capacitance $C_1$ as soon as the voltage at the terminals of $C_1$ passes a given threshold value and initiate the relaxation phenomenon;
$C_2$ represents the capacitance of the conductor C relative to the ground, i.e. to the reference potential or to the earth.

The assembly $C_1$+e conveys the micro-discharge phenomenon to the interface, insulating conductor C. In any hypothesis there exists in fact numerous couples $C_1$+e connected in series or in parallel, corresponding to the electron jumps going from the simple relocation to the micro-breakdown itself, called by physicists by the global term "partial discharge".

A numerical simulation supplies nevertheless very significant results shown in FIGS. 5c to 5f.

Figure 5C:
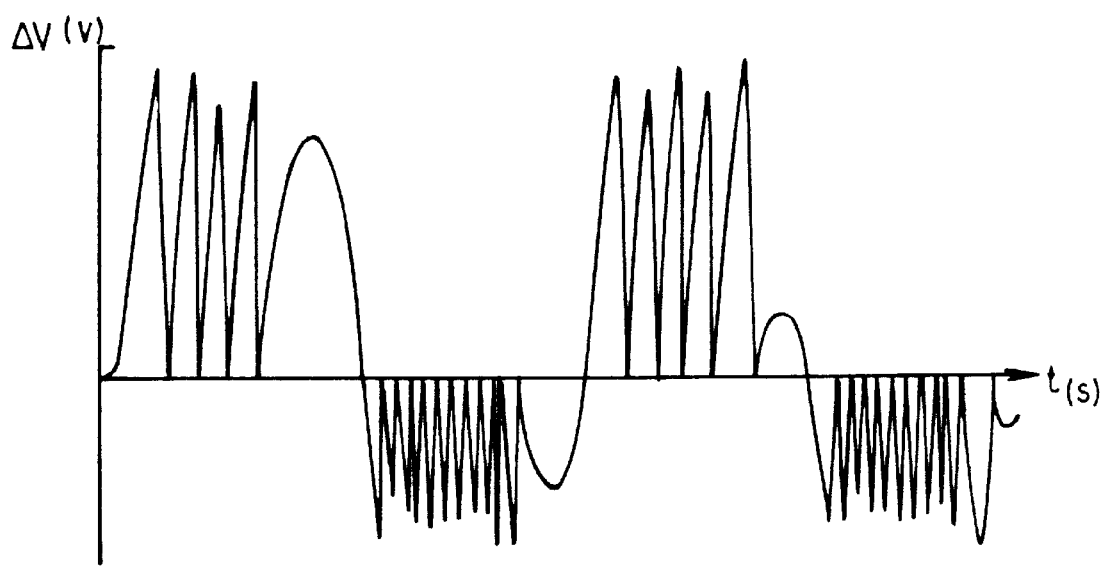
FIGS. 5c to 5f show timing diagrams of these micro-discharge phenomena.

As shown in FIG. 5c, for a source voltage E(t) constituted by a pure sinusoidal voltage of frequency 1 kHz, the voltage at the terminals of the capacitor $C_1$ in the presence of the spark gap e is represented in FIG. 5c for a supposed breakdown voltage twice as great in positive signals as in negative signals.

Figure 5D:
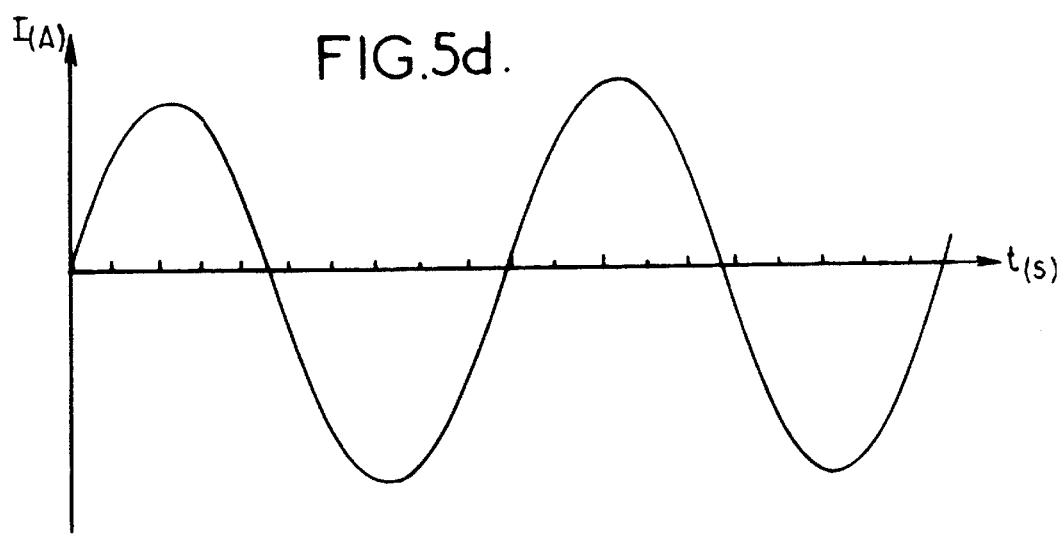

The current in the whole of the circuit as shown in FIG. 5d appears globally little affected by the successive breakdowns caused by the spark gap e.

Figure 5E:
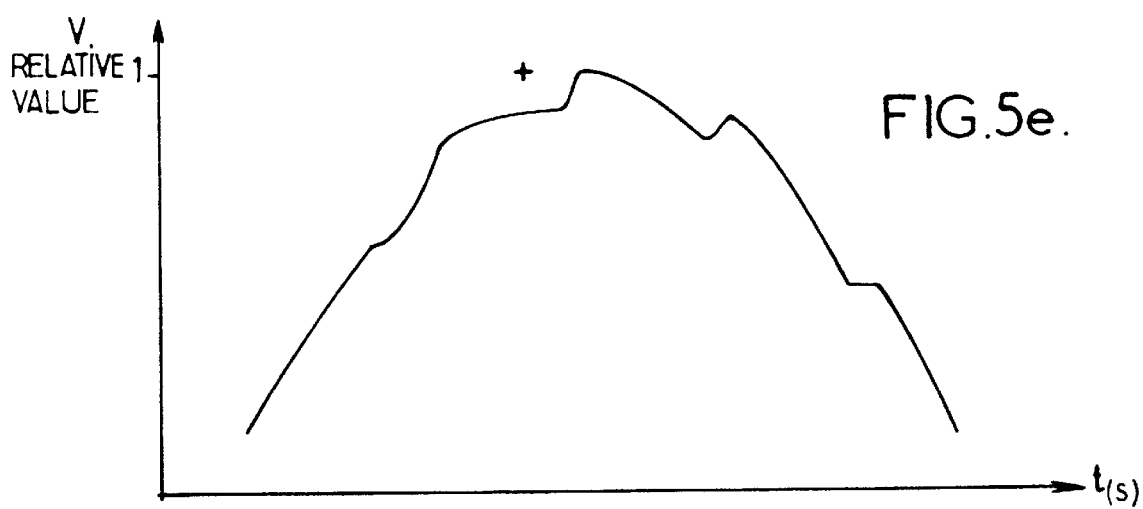
Figure 5F:
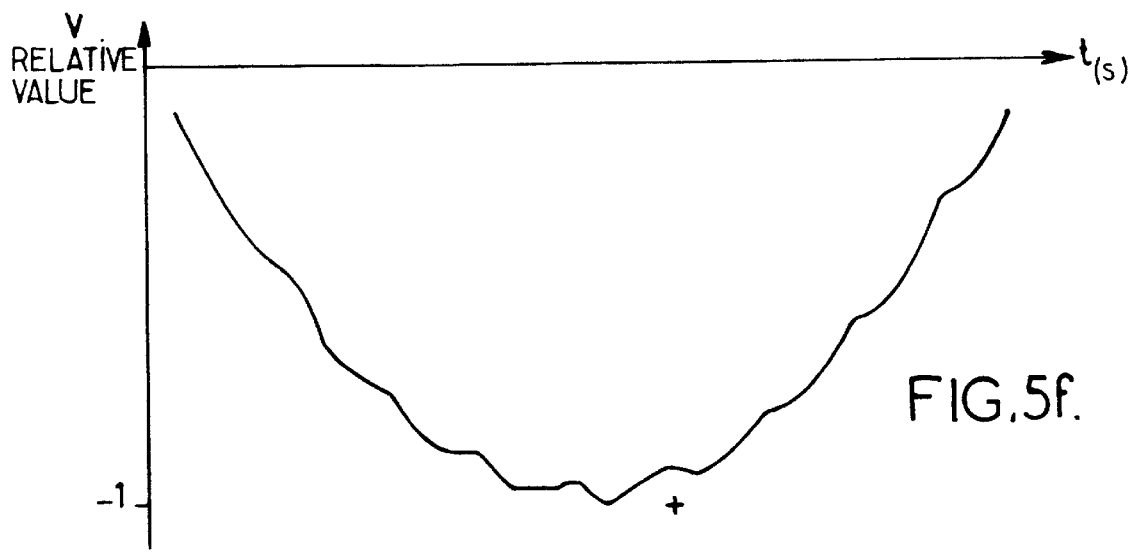

An enlarged view in FIG. 5e and FIG. 5f of a respectively positive and negative crest of the current shown in FIG. 5b, demonstrates the disruptions of this current by the micro-discharges, the frequency of the disruptions appearing highest for the negative crest although the amplitude of these disruptions appears less.

The aforementioned modeling, as represented in FIG. 5b, enables, from FIGS. 5d to 5f, the interpretations below relative to the results obtained to be provided:

the disruptions connected to the micro-discharges appear in the form of a pulse series with locally constant frequency. Their recurrence frequency is likely to fall into the audio frequency spectrum;

the micro-discharges appear individually very short and are not able for this reason to be truly detected with a standard equipment, only the aforementioned recurrence frequency being able to be perceptible;

this recurrence frequency varies as a function of the following parameters:
internal resistance of the discharge circuit
breakdown threshold
signal polarity
value of the breakdown capacitances $C_1$
value of the ground capacitances $C_2$
i.e. following the set of physical and geometrical parameters of the metal/insulation interface.

for a pure sinusoidal signal and of constant amplitude, all the micro-discharges result at the most in one, if the need arises, two additional lines in the audio frequency spectrum, these additional lines being most often buried in the noise. It is no longer the same for a musical signal for which the frequency spectrum is wide and is permanently modified with the appearance of additional lines strongly correlated with the signal. Such additional lines appear then in a quite perceptible way, i.e. audible, whereas they remain however very difficult to detect by classical measurements;

with each micro-discharge, i.e. each micro-breakdown or during return to the previous state, can in all likelihood be associated a delay comparable to that mentioned previously in the description relative to the polarization of the dipolar molecules, this delay causing additional complex phenomena although not modifying the spectrum of additional lines emitted;

for a spectrum of lines with a recurrence period τ, the Laplace transform applied to this latter is of the form 1/1-exp(-τp), which results in a continuous spectrum+ lines spectrum group similar to that of an open transmission line, which enables boiling down to the case of delay or echos phenomena offending many times where musical quality is concerned;

the voltage interferences generated by the interface micro-discharges are very abrupt and therefore very quickly attenuated. For this reason, they only have a local but undoubted influence by radiation or capacitive induction, but have on the contrary a global influence on the intensity of the current flowing in the conductor C.

However, it is necessary to note the existence of a particular mode of propagation at the aforementioned conductor/insulation interface in an insulated cable, this mode of propagation corresponding to a particular solution of the Maxwell equations. The propagation according to this mode of propagation of radiation generated by the interface micro-discharges in a standard insulated conductor C can therefore be excluded.

The problem of micro-discharges at the conductor/insulation interface having been illustrated by means of the modeling proposed in FIG. 5b and the simulation represented in FIGS. 5c to 5f, the accepted solution for implementing the process which is the object of the present invention and the manufacture of cables compensated for corresponding radio interferences, enabling them to be protected from these micro-discharge phenomena as well as from insulation memory phenomena connected to the orientation of the dipolar molecules, appears then justified for the reasons below.

The layer of semi-conductor material, according to the process which is the object of the present invention, enables these micro-discharges creating a local conductor/immediate environment equi-potentiality to be avoided.

Conceiving a screen such as an electrical conductor screen at the potential of the conductor similar to a shield would only postpone the problem because micro-discharges would appear themselves at the surface of this screen.

The recommended solution, according to the object of the present invention, consisting in fact in using a semi-conductor screen is justified as far as this semi-conductor screen is:

sufficiently conductive to create an effective static equi-potentiality, and sufficiently resistant to cancel the currents likely to be caused by the previously described interface micro-discharges. These currents are the transverse or longitudinal propagation currents in the conductor C.

It is understood in the clearest way that the aforementioned semi-conductor screen must be in perfect contact with the conductor C or, more generally, with the insulation such as the enamel layer covering the conductor to protect insofar as remaining vacuoles or surface irregularities would only aggravate the problem.

The phenomenon of interface micro-discharges previously analyzed is not restricted only to cables constituted by conductor wires, but appears also to occur at the level of electronic circuits in the more general sense of the term of these latter.

An investigation in this sense has been led by the inventor, M. JOHANNET, on the basis of the 1 W amplifier described in FIGS. 1, 1g and 1h.

A first investigation consisted in verifying the previous hypothesis at the level of electronic circuits in general. In order to simplify the verification procedure, it consisted in applying on the whole of the circuit, this circuit being made in the form of experimental wiring without any particular precaution, an anti-static fluid layer such as mentioned previously in the description, the PHEMASTAT. The layer of anti-static material was applied in the upper surface and the lower surface of the printed circuit, an in particular on the whole of the components, and in particular on the bare or insulated conductor parts.

Following such a treatment, and all things equal in other respects, i.e. the modulation cables and the amplifier/loud speaker (acoustic enclosure) connection cables having been maintained in their embodiment form according to the object of the present invention, the global result of subjective listening showed itself particularly astounding.

At the subjective analysis level of the results obtained, it is essential to quote:

the disappearance of any impression of subjective distortion;

a sensation of considerable increase of the dynamics of listening, this increase having been brought to the fore by the overall maintenance of the clarity of listening whatever the level of the signal transmitted by the amplifier;

the total disappearance of perceived background noise whereas, paradoxically, the actual background noise of the recording studio, present at the level of the signal delivered by the source, remains very obviously present;

the presence of tone details appropriate to the instruments, which had never been able to be revealed to the listener to by means of normal circuits;

the clarity and precision of the rhythm or tempo in perfect coherence with the melody.

Besides the previous investigation, it is pointed out also that the replacement of the supply cable from the source constituted by a trade optical disc player through a FLAT-LINE type cable covered with a layer of GRAPHITE 33 again improved the listening result. A decisive improvement has finally been obtained by replacing the mains supply cable by a cable provided with conductors compensated for radio interferences, according to the object of the present invention. Indeed, it was able to be observed, during use of the standard supply cables, that the micro-discharges phenomenon, and the degradation of the musical quality, appearing in a much more significant way when, as a function of the direction of the mains power point, the external windings of the supply transformers are connected to the phase conductor rather than the neutral conductor. This observation followed by the aforementioned decisive improvement during use of compensated conductors replacing the supply cable thus provides an additional confirmation of the validity of the phenomenon of micro-discharges.

It is therefore obvious that the phenomena highlighted previously in the description concern in fact all signal processing electronic circuits, and in particular not only the amplifier circuits in HiFi systems, but also supply cables conveying the current from the mains.

In a general way and in a way to obtain a permanence of the desired compensation of radio interference on any electronic circuit, one solution can consist in depositing a layer of semi-conductor material such as a layer of graphite by means of the GRAPHIT 33 material as described previously in the description. This deposit of a layer of semi-conductor material in the form of graphite can be made by spraying the previously described GRAPHIT 33 product or an equivalent product such as the KF—BLINDOTUB applied by the aerosol spray on the transformer windings such as supply transformers and cabling wires connecting the supply to the circuits.

However, as will be described in connection with FIG. 6a for example, it is pointed out that a packaging particularly advantageous for any electronic circuit can consist in providing a sealed enclosure, carrying reference 3, constituted for example by a metal box coated or not in the interior with a layer of protective material such as a layer of polyurethane for example. This enclosure 3 is provided in a way to partially contain the electrical or electronic circuit to package, as well as the semi-conductor material 2 wherein a major part of the electrical or electronic circuit is immersed. It is pointed out, as a non-restrictive example, that in this case, the semi-conductor material 2 can to advantage be made by a gel of appropriate resistivity, as mentioned previously in the description, where the need arises by a saline solution in the conditions mentioned previously in the description. In such a case, and in order to ensure an anti-corrosion protection of the whole of the electronic circuit or, at the very least, the major part of it which is immersed in the semi-conductor material 2, it is pointed out that the electronic circuit, as shown in FIG. 6a, can be globally coated to advantage with a protective film, carrying the reference 10, against corrosion and electrolysis phenomena.

In such a case, it is understood for example that, when the electronic circuit is formed by a printed circuit board CI provided with appropriate electrical conductors in order to ensure the electrical connections and the aforementioned electronic circuit functions, the conductors 1 and the components placed on the opposite surface of the integrated circuit CI playing the role of conductors on the surfaces of which the micro-discharges phenomenon occurs. The whole is then coated with a protective layer 10, this protective layer 10 being able to consist of the application of two or three thin layers of polyurethane spaced out in time for a perfect successive drying of each deposited layer.

Of course, the connection terminals $T_1$, $T_2$, $T_3$, $T'_4$ and $T'_1$, $T'_2$, $T_3$ respectively, are externally provided to the sealed enclosure 3, these terminals such as supply terminals of the electronic circuit and input and output terminals of the signal to process being interconnected to the major part of the immersed electronic circuit. It is understood of course that the connections can be protected in the same way as the electronic circuit itself in order to constitute the major part of the immersed electronic circuit, only the parts external to the sealed passage, supporting the connection terminals, not being of course coated with the anti-corrosion protection layer.

Moreover, the sealed metallic enclosure 3 can be provided with a terminal enabling this sealed enclosure 3 to connect to a reference potential such as the ground of the whole of a more complex device. This terminal carries the reference 30 in FIG. 6a. The input and output terminals carry the references $T_1$ and $T_4$, respectively $T'_1$ to $T'_3$ in a non-restrictive way.

Thus, the processing module, when the sealed enclosure 3 constitutes an electrical screen and if the need arises a magnetic screen of mumetal for example, it is totally protected, not only from external electrical or radio disruptions which are stopped by the screen constituted by the aforementioned sealed enclosure 3, but also from internal radio disruptions constituted by the interface micro-discharges, which enables a processing of the input signal to be obtained approximately exempt form every interference.

It is understood furthermore that because of the greater calorific capacitance of the semi-conductor material 2 in gel form or liquid form than that of air, the problems of cooling are totally resolved, in particular for low power circuits such as electronic or digital processing circuits.

As an advantageous example of such electrical or electronic circuits, the applications of such embodiments to electronic components already encapsulated, such as potentiometers in particular, is pointed out.

Another particularly advantageous embodiment method with a specific packaging of an electric circuit more particularly used in HiFi installations, will now be described in connection with FIG. 6b.

When the electrical circuit is constituted by the coil B0 constituted by conductors 1 of a membrane loud speaker, such as an acoustic enclosure tweeter, the notion of tweeter designating any high frequency loud speaker, the electrical circuit according to the object of the present invention includes, as shown in the aforementioned FIG. 6b, placed between the polar parts PP and the core CO of a permanent magnet, the aforementioned electrical coil B0 formed by a multiple winding of enameled electrical wire for example, this coil B0 being wound in the base of the membrane M of the loud speaker. In its mean position or neutral position, the coil surrounds the core CO of the permanent magnet. Moreover, as shown in the aforementioned FIG. 6b, a semi-conductor material 2 having ferromagnetic properties is placed between the polar parts and the core CO in a way that this semi-conductor material 2, provided with ferromagnetic properties, ensures the total immersion of the coil B0 in its mean position. The semi-conductor material 2 is then subjected to the permanent magnetic confinement field in the space defined by the polar parts PP and by the core CO of the permanent magnet. It is recalled of course that the polar parts PP are connected by a magnetic circuit CM in the standard way.

In a particular embodiment method, it is pointed out that the semi-conductor material 2 having ferromagnetic properties was constituted by a mixture of 70 to 90% by weight of FERROFLUIDE, and of 30 to 10% by weight of a slightly electrical conducting miscible pulverulent material.

The pulverulent material being pulverulent graphite mixed in the proportions indicated relative to the FERROFLUIDE. Perceptible results have been obtained, the semi-conductor material 2 having ferromagnetic properties in this way obtained having been packaged in a way to have a resisitivity coefficient $\rho$ between 0.1 $\Omega \times m$ and 10 $\Omega \times m$.

Finally, in all the cases where an encapsulation of the electrical or electronic circuit cannot be made, very good results have been obtained by spraying on the electrical enameled wire conductor a graphite aerosol, such as the GRAPHIT 33 mentioned previously, and by proceeding with a careful wiping of the excess product. This is the case in particular for:

transformers and their connecting networks;

bundles of cables intended for the supply;

loud speaker movable coils wherein the FERROFLUIDE is not used;

in general, all non-encapsulable insulated conductors.

As a general conclusion, it will be pointed out that the insulation/conductor interface micro-discharge phenomena appear strongly associated with the memory phenomena of the insulations.

In fact, the musical signals, i.e. the electronic signals at the audio frequencies, conveyed in the form of voltage in the conductors, cause micro-discharges at the conductor/insulation interfaces.

By interface micro-discharges, it is necessary to understand the whole of the phenomena below:

changing orientation of the insulating molecules in contact or near to the conductors, this phenomenon not being appreciably different from the phenomenon of orientation or displacement of the dipolar molecules, such as been highlighted with regard to the memory of insulations;

jumping electrons, either by discharge, or by tunnel effect;

partial discharge in the metal-insulation or insulation-insulation interstices;

crown micro-effect around the conducting peaks which always exist in the molecular scale on the surface of conductor materials.

It will be noted that the whole of the micro-discharges phenomena occur even for very weak signals, for example those stemming from a movable coil cell.

These micro-discharges are probably polarized, i.e. that they occur in a more distinct way for a polarity of the signal than for the reverse polarity. This observation leads to highlight a phenomenon of rectification of the global interference signal, which is added to the useful signal and produces an apparently audible distortion despite the weakness of the phenomenon.

While the triggering of the micro-discharges at the time of the appearance of a voltage, i.e. a signal to transmit, is in all likelihood immediate, the same as in the Branly effect, the return under the effect of a reverse voltage can take place with a delay, which produces the effect of memory dragging or distortion experienced in the listening.

Finally, the complete processing of an installation, such as a HiFi system for example, and in particular supply cables for the whole of the elements constituting it, give entirely surprising results at the level of the subjective listener, the results, of subjective listening, being able to be analyzed in total absence of distortion even at levels bordering on the limiting peak;

complete separation of the tonal planes;

appearance of completely undreamed of tonal information, giving an impression of listening live;

appearance of nuances in the low register, not perceived previously;

complete disappearance of background noise, only the useful signal being heard.

The last aforementioned point is certainly the most spectacular because the most immediate. It can be attributed to the fact that the background noise, although present, occurs in a form of white noise totally uncorrelated with the signal to transmit, the ear not then having any difficulty in separating the useful signal from the background noise.

Another characteristic of the aforementioned subjective results concerns the overall retention of the physiology of the sounds transmitted by means of the signal, insofar as the subjective balance of the different frequency bands making up the low pitch, medium low, medium, medium high and high pitched signal transmitted on the 20 Hz to 20 kHz band appeared particularly remarkable.

Likewise, as regards the dynamics of the listening, it is pointed out that, in obvious connection with the total absence of distortion, the listening at low level is approximately the same as the listening at high level, the tonal planes being globally conserved as well as the stereo image enabling a listener to localize, at least perceptually, the different musical instruments generating the signals transmitted to the recording.

The test carried out in the laboratory by the inventor, M. JOHANNET, from a commercial optical disc player source with the PHILIPS trade mark, of entirely standard model, associated with an amplifier such as described in connection with FIGS. 1$g$ and 1$h$ and associated with mono-channel acoustic enclosures of entirely any quality, has enabled globally a hearing of a quality such that the mediocre quality of acoustic enclosures was itself concealed.

For a more exact definition of the parameters of listening and of subjective dynamic qualities, subjective balance and stereophonic image, one should usefully refer to the journal "Prestige Audio Video", No. 15, September 1996, edited and published in France by the publishing company P.V. Editions, Service Rèdaction Publicitè, 5 boulevard Ney, 75018 Paris.

What is claimed is:

1. An electrical circuit compensated for radio interference generated by electrical micro-discharge phenomena present on an external surface of said circuit when said circuit is supplied with an electrical voltage, comprising a semi-conductor material coating on said external surface, said semi-conductor material coating having a resistivity coefficient value between 0.1 $\Omega \times m$ and 100 $\Omega \times m$, whereby said external surface of the electrical circuit is maintained at a constant static electrical potential value close to that of the circuit while substantially all of the random electrical discharge currents caused by said interference phenomena is absorbed, said semiconductor material being one of a liquid and a gel, and said circuit further comprising:

a sealed enclosure partially containing said electrical circuit and said semi-conductor material in which a major part of the electrical circuit is immersed; and terminal connections external to the sealed enclosure and interconnected to said major part of the immersed electrical circuit.

2. An electrical circuit according to claim 1, wherein said major part of the electrical circuit immersed in said semi-conductor material further comprises an anti-corrosion electrically insulating protective film.

3. An electrical circuit according to claim 2, wherein said semi-conductor material is a saline solution having a resistivity coefficient between 0.1 $\Omega \times m$ and 10 $\Omega \times m$.

4. An electrical circuit compensated for radio interference generated by electrical micro-discharge phenomena present on an external surface of said circuit when said circuit is supplied with an electrical voltage, comprising a semi-conductor material coating on said external surface, said semi-conductor material coating having a resistivity coefficient value between 0.1 $\Omega \times m$ and 100 $\Omega \times m$, whereby said external surface of the electrical circuit is maintained at a constant static electrical potential value close to that of the circuit while substantially all of the random electrical discharge currents caused by said interference phenomena is absorbed, said circuit further comprising:

an electrically conducting sealed enclosure, said sealed enclosure including a terminal connection whereby, during operation, said sealed enclosure is set to a reference electrical potential, and including a plurality of sealed passages for respective input-output terminals;

a processing module housed in said enclosure and interconnected by interconnection wires to said input-output terminals, said processing module and interconnection wires being covered with an inert electrically insulating film; and a semi-conductor material filling said sealed enclosure and surrounding said processing module.

5. An electrical circuit according to claim 4, wherein said semi-conductor material is solid.

6. An electrical circuit according to claim 4, wherein said semi-conductor material is one of a liquid and a gel.

7. An electrical circuit according to claim 4, wherein said semi-conductor material is in gel form.

8. An electrical circuit compensated for radio interference generated by electrical micro-discharge phenomena present on an external surface of said circuit when said circuit is supplied with an electrical voltage, comprising a semi-conductor material coating on said external surface, said semi-conductor material coating having a resistivity coefficient value between 0.1 $\Omega \times m$ and 100 $\Omega \times m$, whereby said external surface of the electrical circuit is maintained at a constant static electrical potential value close to that of the circuit while substantially all of the random electrical discharge currents caused by said interference phenomena is absorbed, said circuit further comprising a high frequency membrane loud speaker including:

a membrane;

a permanent magnet having polar parts and a core;

an electrical coil located between the polar parts and the core of the permanent magnet, and formed by a multiple enameled electrical wire coil, wound on the base of said membrane, said coil having a mid position surrounding said core of the permanent magnet; and a semi-conductor material having ferromagnetic properties, disposed between said polar parts and said coil, to provide total immersion of said coil in said mid position, whereby said material is subjected to a permanent confining magnetic field between the polar parts and the core of the permanent magnet.

9. An electrical circuit according to claim 8, wherein said semi-conductor material having ferromagnetic properties comprises a mixture of:

70 to 90% by weight of FERROFLUIDE 30 to 10% by weight of a pulverulent miscible material, weakly electrically conducting, said mixture having a resistivity coefficient between 0.1 $\Omega \times m$ and 10 $\Omega \times m$.

10. An electrical circuit according to claim 8, wherein said semi-conductor material is solid.

11. An electrical circuit according to claim 8, wherein said semi-conductor material is one of a liquid and a gel.

12. An electrical circuit according to claim 8, wherein said semi-conductor material is in gel form.

* * * * *